US010607980B2

(12) United States Patent
Lan et al.

(10) Patent No.: US 10,607,980 B2
(45) Date of Patent: Mar. 31, 2020

(54) PASSIVE-ON-GLASS (POG) DEVICE AND METHOD

(71) Applicant: QUALCOMM Incorporated, San Diego, CA (US)

(72) Inventors: Je-Hsiung Jeffrey Lan, San Diego, CA (US); Niranjan Sunil Mudakatte, San Diego, CA (US); Changhan Hobie Yun, San Diego, CA (US); Daeik Daniel Kim, Del Mar, CA (US); Chengjie Zuo, San Diego, CA (US); David Francis Berdy, San Diego, CA (US); Mario Francisco Velez, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/861,140

(22) Filed: Jan. 3, 2018

(65) Prior Publication Data
US 2018/0145062 A1 May 24, 2018

Related U.S. Application Data

(62) Division of application No. 14/853,701, filed on Sep. 14, 2015, now Pat. No. 9,893,048.

(51) Int. Cl.
*H01L 27/01* (2006.01)
*H01L 23/15* (2006.01)
(Continued)

(52) U.S. Cl.
CPC ............ *H01L 27/01* (2013.01); *H01G 2/02* (2013.01); *H01L 21/4846* (2013.01);
(Continued)

(58) Field of Classification Search
CPC ... H01L 28/00; H01L 28/10; H01L 28/40–92; H01L 28/75; H01L 21/4846;
(Continued)

(56) References Cited

U.S. PATENT DOCUMENTS 4,638,400 A   1/1987   Brown et al.
6,268,225 B1  7/2001   Chen et al.
(Continued)

FOREIGN PATENT DOCUMENTS

JP   S62118560 A   5/1987
JP   H1140458 A    2/1999
(Continued)

OTHER PUBLICATIONS

International Search Report and Written Opinion—PCT/US2016/044865—ISA/EPO—dated Feb. 10, 2017.
(Continued)

*Primary Examiner* — Natalia A Gondarenko
(74) *Attorney, Agent, or Firm* — Moore IP/Qualcomm

(57) ABSTRACT

A device includes a glass substrate and a capacitor. The capacitor includes a first metal coupled to a first electrode, a dielectric structure, and a via structure comprising a second electrode of the capacitor. The first metal structure is separated from the via structure by the dielectric structure.

20 Claims, 12 Drawing Sheets

(51) Int. Cl.
*H01L 23/522* (2006.01)
*H01L 49/02* (2006.01)
*H01L 23/498* (2006.01)
*H01L 21/48* (2006.01)
*H01G 2/02* (2006.01)
*H01G 4/005* (2006.01)

(52) U.S. Cl.
CPC ........ *H01L 23/15* (2013.01); *H01L 23/49822* (2013.01); *H01L 23/5223* (2013.01); *H01L 23/5227* (2013.01); *H01L 28/10* (2013.01); *H01L 28/75* (2013.01); *H01G 4/005* (2013.01); *H01L 23/49816* (2013.01); *H01L 2224/11* (2013.01)

(58) Field of Classification Search
CPC ............. H01L 2224/16; H01L 2224/11; H01L 2224/48137; H01L 2224/45015; H01L 2924/15787; H01L 2924/19041; H01L 2924/15788; H01L 23/15; H01L 23/50; H01L 23/645; H01L 23/5222; H01L 23/5223; H01L 23/5227; H01L 23/642; H01L 23/49822; H01L 23/49816; H01L 2223/6655; H01L 27/01; H01L 27/016; H01L 27/0629; H01L 27/0676; H01L 27/0716; H01L 27/0722; H01L 27/0288; H01L 27/0727; H01L 27/0733; H01L 27/0788; H01L 27/0794; H01L 27/1255; H01L 27/3265; H01L 27/1266; H01L 27/0805; H01L 27/12; H01L 27/13; H01L 2924/1901; H01L 2924/19101; H01L 2924/19102; H01L 2924/19105; H01L 2924/19103; H01L 2924/19011; H01L 2924/19015; H01L 2924/1902; H01L 2924/1904; H01L 21/02422; H01L 21/28; H01L 21/28562; H01L 21/311; H01L 21/31105; H01L 21/44; H01L 21/441; H01L 21/481; H01L 21/461; H01G 2/02; H01G 4/005; H01G 2/065; H01G 4/018; H01G 4/105; H01G 4/33
USPC ................ 257/528–532, 758, 737, 306, 535; 438/381, 637, 614, 398, 396, 393
See application file for complete search history.

(56) References Cited

U.S. PATENT DOCUMENTS

| | | | |
|---|---|---|---|
| 6,853,051 | B2 | 2/2005 | Shioga et al. |
| 9,001,031 | B2 | 4/2015 | Lo et al. |
| 9,612,615 | B2* | 4/2017 | Lin ........................ H01L 21/563 |
| 2001/0010955 | A1 | 8/2001 | Chen |
| 2004/0137692 | A1 | 7/2004 | Nam |
| 2006/0126254 | A1 | 6/2006 | Auriel et al. |
| 2007/0158848 | A1 | 7/2007 | Matsumoto et al. |
| 2008/0174976 | A1* | 7/2008 | Satoh ................. H01L 23/49822 |
| | | | 361/762 |
| 2009/0140421 | A1 | 6/2009 | Lin et al. |
| 2010/0244193 | A1* | 9/2010 | Lin ....................... H01L 21/6835 |
| | | | 257/532 |
| 2010/0301452 | A1 | 12/2010 | Wang |
| 2011/0042127 | A1* | 2/2011 | Ohtsuka ................. H01L 24/02 |
| | | | 174/255 |
| 2011/0171806 | A1* | 7/2011 | Mi ......................... H01F 17/0006 |
| | | | 438/381 |
| 2011/0304014 | A1 | 12/2011 | Laporte et al. |
| 2012/0261787 | A1 | 10/2012 | Stamper |
| 2013/0242500 | A1* | 9/2013 | Lin ........................ H01L 21/563 |
| | | | 361/679.32 |
| 2013/0278568 | A1 | 10/2013 | Lasiter et al. |
| 2014/0028543 | A1* | 1/2014 | Lo ......................... H01F 17/0006 |
| | | | 345/156 |
| 2014/0134801 | A1 | 5/2014 | Chen et al. |
| 2014/0197902 | A1 | 7/2014 | Zuo et al. |
| 2015/0014812 | A1 | 1/2015 | Lan et al. |
| 2015/0262938 | A1 | 9/2015 | Lin et al. |
| 2017/0077079 | A1 | 3/2017 | Lan et al. |

FOREIGN PATENT DOCUMENTS

| | | |
|---|---|---|
| JP | 2002043517 A | 2/2002 |
| JP | 2007142109 A | 6/2007 |
| JP | 2007149827 A | 6/2007 |
| JP | 2008192653 A | 8/2008 |
| JP | 2010268304 A | 11/2010 |
| JP | 2012074649 A | 4/2012 |
| JP | 2012079752 A | 4/2012 |
| JP | 2013012579 A | 1/2013 |
| JP | 2015088508 A | 5/2015 |

OTHER PUBLICATIONS

Partial International Search Report—PCT/US2016/044865—ISA/EPO—dated Nov. 29, 2016.

\* cited by examiner

US 10,607,980 B2

PASSIVE-ON-GLASS (POG) DEVICE AND METHOD

I. CROSS REFERENCE TO RELATED APPLICATIONS

The present application claims priority from and is a divisional application of pending U.S. patent application Ser. No. 14/853,701, filed Sep. 14, 2015, entitled "PASSIVE-ON-GLASS (POG) DEVICE AND METHOD," the content of which is incorporated by reference herein in its entirety for all purposes.

II. FIELD

The present disclosure is generally related to a passive-on-glass (POG) device.

III. DESCRIPTION OF RELATED ART

Radio-frequency (RF) filters may include an integrated passive device (IPD), such as a passive-on-glass (POG) device (e.g., a capacitor and/or an inductor). A conventional capacitor may be formed using a process that has 6 mask steps as part of an IPD fabrication process. Each mask used in the IPD fabrication process increases process cycle time, complexity, and cost to form an IPD.

IV. SUMMARY

In a particular aspect, a device includes a glass substrate and a capacitor. The capacitor includes a first metal structure including a first electrode, a dielectric structure, and a via structure including a second electrode. The first metal structure is separated from the via structure by the dielectric structure.

In another particular aspect, a method includes forming a first metal structure of a passive device and depositing a first dielectric material on a glass substrate. The method further includes planarizing the first dielectric material to form a first dielectric layer and creating a cavity in the first dielectric layer to expose a surface of a dielectric structure of the passive device. The dielectric structure is positioned on the first metal structure. The method also includes forming a second metal structure of the passive device on the dielectric structure.

In another particular aspect, a method includes forming a first metal structure of a first passive device and a second metal structure of a second passive device. The method further includes depositing a first dielectric material on a glass substrate. The method also includes planarizing the first dielectric material to form a first dielectric layer. The method includes creating a first cavity in the first dielectric layer to expose a first surface of a dielectric structure of the first passive device and a second cavity to expose a second surface of the second metal structure. The dielectric structure is positioned on the first metal structure. The method also includes forming a third metal structure of the first passive device on the dielectric structure and a fourth metal structure of the second passive device on the second metal structure.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Particular aspects of the present disclosure are described below with reference to the drawings. In the description, common features are designated by common reference numbers.

Figure 1:
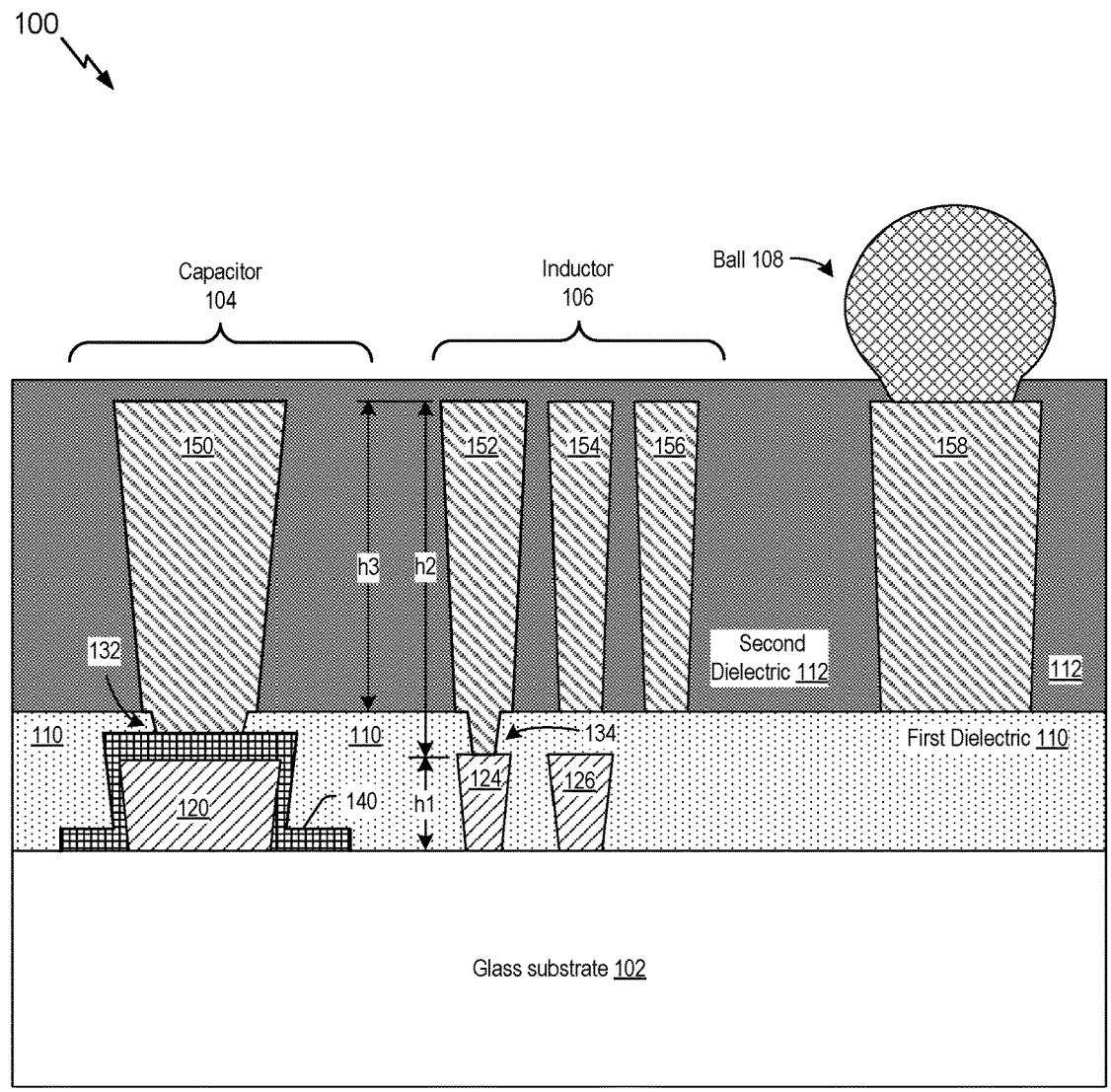
FIG. 1 is a cross-section view of a device structure of a particular illustrative aspect of an electronic device having a passive device.

Referring to FIG. 1, a first particular illustrative aspect of a device 100 (e.g., an electronic device) that includes a passive device, e.g., a passive-on-glass (POG) device, is shown. As illustrated in FIG. 1, the device 100 is shown as a cross-sectional view. The device 100 may include a glass substrate 102. The passive device may be formed on, in, or through the glass substrate 102. As used herein, "on" may include being in direct contact with and/or being above. The passive device may include an integrated electrical component (e.g., not merely a wire). For example, the passive device may include a capacitor 104, such as a metal-insulator-metal (MIM) capacitor, an inductor 106, or both. The capacitor 104 may be coupled to the inductor 106, and the device 100 may be configured to operate as a radio frequency (RF) resonator or filter. The device 100 (e.g., the passive device) may be included in a wafer (not shown) that includes multiple passive devices.

Although the device 100 is illustrated as including the capacitor 104 and the inductor 106, in other implementations, the device 100 may include the capacitor 104 or the inductor 106. For example, in some implementations, the device 100 may include the capacitor 104 and not the inductor 106.

The device 100 may include a first dielectric layer 110 (e.g., a first inter-layer dielectric (ILD)) and a second dielectric layer 112. A dielectric material of the first dielectric layer 110 and/or the second dielectric layer 112 may include polyimide (PI), benzocyclobuten (BCB), polybenzoxazole (PBO), an acrylic, an epoxy, and/or other materials, as illustrative, non-limiting examples. As an illustrative, non-limiting example, the second dielectric layer 112 may be a PI layer. In some implementations, the first dielectric layer 110 and the second dielectric layer 112 may include different materials. In other implementations, the first dielectric layer 110 and the second dielectric layer 112 may include the same material.

The device 100 may include a M1 layer (e.g., a metal 1 layer) and a M2 layer (e.g., a metal 2 layer). The M1 layer may be associated with first metal structures 120, 124, 126. The M2 layer may be associated with second metal structures 150, 152, 154, 156, 158. Metal structures may include metal islands or metal lines, as an illustrative, non-limiting example.

The capacitor 104 may include metal structures, such as the first metal structure 120 and the second metal structure 150. In some implementations, a first portion 132 of the second metal structure 150 may be correspond to a via structure, such as a V1 (e.g., a via 1 layer) of the device 100. The capacitor 104 further includes a dielectric structure 140 (e.g., a dielectric layer). The capacitor 104 may include a first electrode and a second electrode separated by an insulator, such as the dielectric structure 140. The first electrode, such as a bottom electrode, may include or correspond to the first metal structure 120. The second electrode, such as a top electrode, may include or correspond to the second metal structure 150. For example, the second electrode may correspond to the first portion 132 of the second metal structure 150. Although the first portion 132 is illustrated as being part of the second metal structure 150, in other implementations, the first portion 132 may be a via structure that is distinct from the second metal structure 150.

Each of the first metal structure 120 and the second metal structure 150 may include a conductive material, such as copper (Cu), aluminum (Al), and/or aluminum-copper (AlCu), as illustrative, non-limiting examples. In some implementations, the first metal structure 120 and the second metal structure 150 may include different conductive materials. In other implementations, the first metal structure 120 and the second metal structure 150 include the same conductive material. In a particular implementation, the conductive material of the first metal structure 120 and the second metal structure 150 is copper (Cu).

The dielectric structure 140 may include one or more dielectric materials. For example, the dielectric structure 140 may include tantalum pentoxide ($Ta_2O_5$), silicon nitride ($SiN_x$), silicon dioxide ($SiO_2$), silicon oxynitride ($SiO_xN_y$), and/or aluminum oxide (e.g., $AlO_{x\ and/or}\ Al_2O_3$), as illustrative, non-limiting examples.

In some implementations, the capacitor 104 may include one or more seed layers (not shown). For example, a first seed layer may be positioned between the glass substrate 102 and the first metal structure 120. The first seed layer may include copper (Cu), titanium (Ti), tungsten (W), or a combination thereof, as illustrative, non-limiting examples. In some implementations, the first seed layer and the first metal structure 120 may include the same material. As another example, a second seed layer may be positioned between the dielectric structure 140 and the second metal structure 150, as described further with reference to FIG. 2. The second seed layer may include copper (Cu), titanium (Ti), tungsten (W), or a combination thereof, as illustrative, non-limiting examples.

The inductor 106 may include metal structures, such as the first metal structures 124, 126 and second metal structures 152, 154, 156. One or more metal structures of the inductor 106 may include a conductive material, such as copper (Cu), as an illustrative, non-limiting example. The first metal structures 124, 126 may include correspond to an underpass of the inductor 106 and the second metal structures 152, 154, 156 may include or correspond to a winding of the inductor 106. In some implementations, the inductor 106 may be a spiral inductor.

In some implementations, a portion 134 of the second metal structure 152 may correspond to a via structure, such as a V1 (e.g., a via 1 layer) of the device 100. Although the portion 134 is illustrated as being part of the second metal structure 152, in other implementations, the portion 134 may be a via structure that is distinct from the second metal structure 152.

In some implementations, the inductor 106 may include one or more seed layers (not shown). For example, a first seed layer may be positioned between the glass substrate 102 and each of the first metal structures 124, 126. The first seed layer may include titanium (Ti), copper (Cu), tungsten (W), or a combination thereof, as illustrative, non-limiting examples. In some implementations, the first seed layer and the first metal structures 124, 126 may include the same material. As another example, a second seed layer may be positioned below each of the second metal structures 152, 154, 156. For example, the second seed layer may be positioned between the second metal structure 152 and the first dielectric layer 110 and/or the first metal structure 124. As another example, the second seed layer may be positioned between each of the second metal structures 154, 156 and the first dielectric layer 110. The second seed layer may include copper (Cu), titanium (Ti), tungsten (W), or a combination thereof, as illustrative, non-limiting examples.

The capacitor 104 and/or the inductor 106 may be coupled to the second metal structure 158. The second metal structure 158 may be associated with an input terminal or an output terminal. For example, an end of the second metal structure 158 may be configured as a connection pad and/or may be coupled to a connection pad. The second metal structure 158 may be coupled to a ball 108 (e.g., a solder ball), such as a wafer level chip scale packaging (WLCSP) ball. The ball 108 may be configured to couple the device 100 to another device or structure, such as a chip. Although the device 100 is illustrated as including the ball 108, in other implementations, the device 100 may not include the ball 108.

During operation of the device 100, one or more electrical charges (e.g., charges provided in response to an alternating current (AC) voltage or a direct current (DC) voltage from a signal/power source) may be applied to the device 100 via the second metal structure 158. For example, a charge may be associated with a radio frequency (RF) signal to be filtered. The charge may be applied to the capacitor 104 and/or the inductor 106. For example, the capacitor 104 and the inductor 106 may be configured as an RF filter. The capacitor 104 and/or the inductor 106 may provide an output via a metal structure (not shown) of the device 100.

In some implementations, a first metal height (h1), such as a M1 layer height, of one or more of the first metal structures 120, 124, 126 may be greater than or equal to three micrometers (μm). In some implementations, the first metal height (h1) may be greater than or equal to five micrometers. In other implementations, the first metal height (h1) may be greater than or equal to ten micrometers. By having the first metal height (h1) that is greater than or equal to three micrometers, the first metal structure 120 of the capacitor 104 may have a reduced resistance as compared to a capacitor having a bottom electrode of aluminum-copper (AlCu) that is less than three micrometers thick formed on a glass substrate. By having a reduced resistance, a performance of the capacitor 104 may be improved as compared to a conventional capacitor with a bottom electrode height of less than three micrometers. Additionally, the first metal height (h1) and/or the first metal structures being copper (Cu) may enable the first metal structures 124, 126 to be used as an underpass of the inductor 106.

In some implementations, a second metal height (h2) of the second metal structure 152 may be greater than or equal to ten micrometers. In some implementations, the second metal height (h2) may be greater than or equal to fifteen micrometers. In some implementations, the second metal height (h2) may be greater than or equal to twenty micrometers. In other implementations, the second metal height (h2) may be greater than or equal to thirty micrometers. Additionally or alternatively, a third metal height (h3) (e.g., corresponding to a M2 layer height) of a top surface of one or more of the second metal structures 150-158 relative to a surface of the first dielectric layer 110 may be greater than or equal to ten micrometers. In some implementations, the third metal height (h3) may be greater than or equal to fifteen micrometers. In some implementations, the third metal height (h3) may be greater than or equal to twenty micrometers. In other implementations, the third metal height (h3) may be greater than or equal to thirty micrometers. The second metal structures 150-158 may be formed as single structures (e.g., not multiple structures stacked one on top of the other), which may enable a single dielectric layer (e.g., the second dielectric layer 112) to be deposited to insulate the second metal structures 150-158. The single dielectric layer (e.g., the second dielectric layer 112) may reduce effects of wafer warpage during manufacturing of the passive device.

One or more passive devices included in the device 100 may have improved performance as compared to conventional passive devices. For example, the capacitor 104 may have a higher Q (e.g., quality factor) than a conventional capacitor. To illustrate, the capacitor 104 may have a higher Q resulting from a reduced resistance of the first metal structure 120 due to a thickness (e.g., a height) of the first metal structure as compared to the conventional capacitor. As another example, the conventional capacitor may use a metal structure (e.g., a metal 2 (M2) layer) as the top electrode. A performance of the conventional capacitor may be limited by a contact area between a metal structure (e.g., the metal 2 (M2) layer) and a via structure (e.g., a via 2 (V2) layer that couples the M2 layer to a metal 3 (M3) layer structure, such as a redistribution layer (RDL) structure. By using the first portion 132 of the capacitor 104 as the top electrode, the first portion 132 (e.g., the via structure) may have a larger cross-sectional area (e.g., diameter) and a reduced resistance as compared to the via structure of the conventional capacitor, which may result in higher Q of the capacitor 104 as compared to the conventional capacitor. Additionally, device 100 may be formed using a reduced mask count as compared to conventional methods of forming POG devices, as described further herein, which may reduce a cost of manufacturing and may reduce a manufacturing cycle time.

Figure 2:
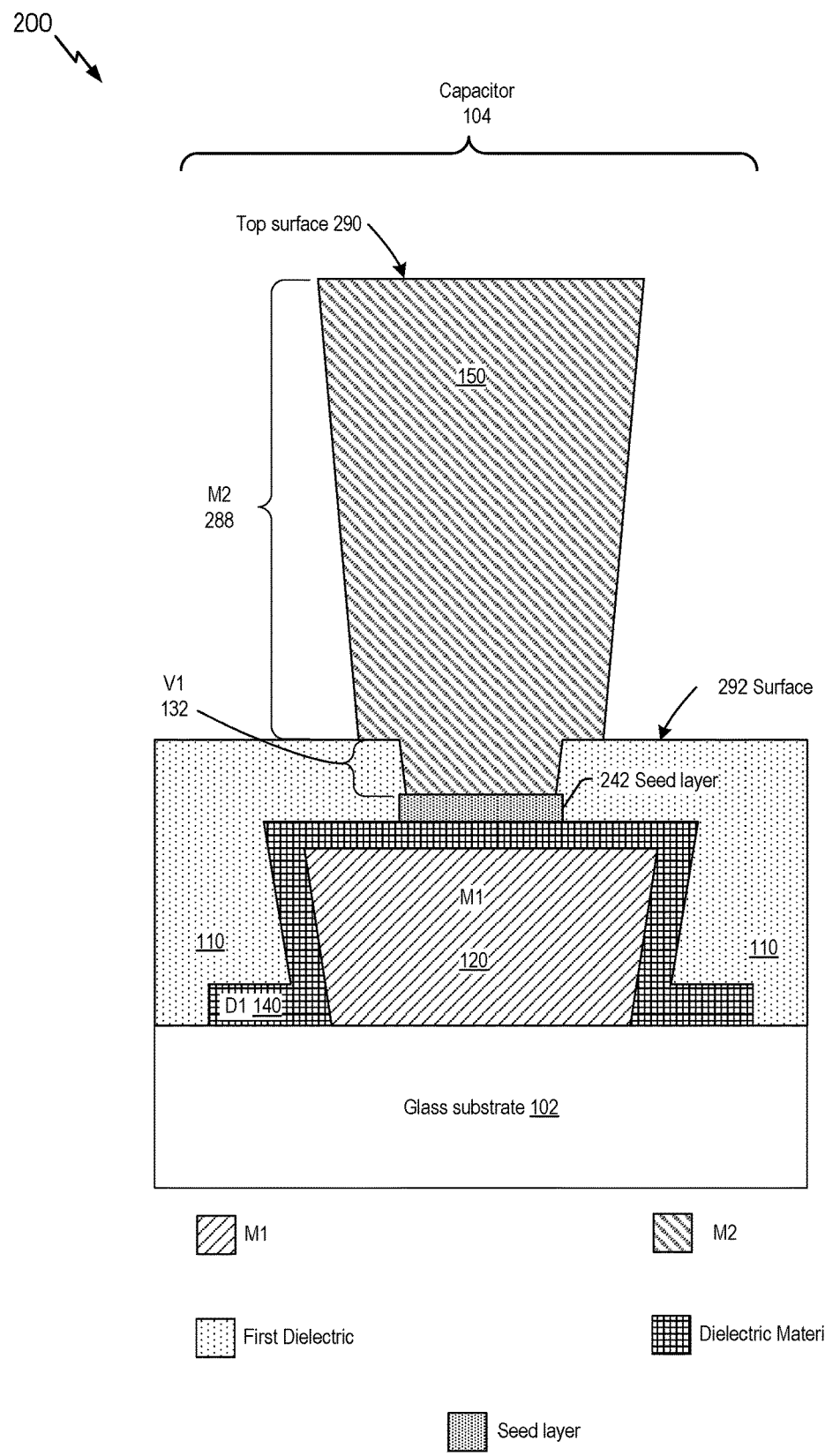
FIG. 2 is a cross-section view of a particular illustrative example of a capacitor of the electronic device of FIG. 1.

Referring to FIG. 2, an illustrative example of a device 200 (e.g., an electronic device) that includes a passive device, e.g., a passive-on-glass (POG) device, is shown. The device 200 is shown as a cross-sectional view. For example, the device 200 may include the capacitor 104, such as a metal-insulator-metal (MIM) capacitor, formed on the glass substrate 102.

The capacitor 104 may include the first metal structure 120, the dielectric structure 140, a seed layer 242, and the second metal structure 150. The dielectric structure 140 may be positioned between the first metal structure 120 and the second metal structure 150. The seed layer 242 may be positioned between the dielectric structure 140 and the second metal structure 150. In the orientation illustrated in FIG. 2, a top surface 290 of the second metal structure 150 is above a surface (e.g., a surface 292), such as a planarized surface, of the first dielectric layer 110. In some implementations, the second metal structure 150 may include the first portion 132 and a second portion 288. The first portion 132 may correspond to a via structure, and the second portion 288 may correspond to a redistribution layer (RDL) structure. Although the first portion 132 (e.g., the via structure) and the second portion 288 are both illustrated as part of the second metal structure 150, in other implementations, the first portion 132 and the second portion 288 may be distinct structures. In a particular implementation, the capacitor 104 includes the first metal structure 120, the dielectric structure 140, and the via structure (e.g., the first portion 132 of the second metal structure 150). In this implementation, the capacitor 104 may include the seed layer 242.

Each of the first metal structure 120 and the second metal structure 150 (e.g., the first portion 132 and/or the second portion 288) may include a conductive material, such as copper (Cu), as an illustrative, non-limiting example. The dielectric structure 140 may include tantalum pentoxide ($Ta_2O_5$), silicon nitride (SiN), silicon dioxide ($SiO_2$), silicon oxynitride (SiON), aluminum oxide ($Al_2O_5$), or a combination thereof. The seed layer 242 may be formed on the dielectric structure 140. The seed layer 242 may include copper (Cu), titanium (Ti), tungsten (W), or a combination thereof, as illustrative, non-limiting examples. Although the seed layer 242 is illustrated as a single layer, in other implementations, the seed layer 242 may include multiple layers. For example, the seed layer 242 may include a first seed layer formed on the dielectric structure 140 and a second seed layer formed on the first seed layer. The second metal structure 150 (e.g., the first portion 132) may be formed on the second seed layer. In some implementations, the first seed layer may include titanium (Ti), copper (Cu), tungsten (W), or titanium tungsten (TiW), as illustrative, non-limiting examples. The second seed layer may include copper (Cu), as an illustrative, non-limiting example.

In some implementations, the first metal structure 120 may correspond to a M1 layer (e.g., a metal 1 layer) of the device 200. The first portion 132 (e.g., the via structure) of the second metal structure 150 may correspond to a V1 layer (e.g., a via 1 layer) of the device 200. The second portion 288 (e.g., the RDL structure) of the second metal structure 150 may correspond to a M2 layer (e.g., a metal 2 layer) of the device 200. The first portion 132 (e.g., the via structure) may be formed on the seed layer 242. The first portion 132 (e.g., the via structure, such as the V1 layer) may be coupled, such as physically coupled, to the second portion 288 (e.g., the M2 layer). Additionally, the first portion 132 (e.g., the via structure, such as the V1 layer) may be positioned between the first metal structure 120 (e.g., the M1 layer) and the second portion 288 (e.g., the M2 layer). The first portion 132 (e.g., the via structure, such as the V1 layer) may be separated from the first metal structure 120 (e.g., the M1 layer) by the dielectric structure 140. In a particular implementation, the capacitor 104 includes a single seed layer, such as the seed layer 242 positioned between dielectric structure 140 and the second metal structure 150 (e.g., the first portion 132 and the second portion 288).

The capacitor 104 may include a first electrode and a second electrode separated by a dielectric structure (D1), such as the dielectric structure 140. For example, the first metal structure 120 may correspond to the first electrode and the first portion 132 (e.g., the via structure) may correspond to the second electrode. In some implementations, the second electrode may include or correspond to the first portion 132 and the seed layer 242.

The capacitor 104 may include an improved RF performance (e.g., a capacitor Q-factor of a capacitor) as compared to a conventional passive device. Additionally, the capacitor 104 may be formed using a reduced mask count as compared to a conventional capacitor, as described further with reference to FIGS. 3A-3F, 4A-4E, and 5. Accordingly, the capacitor 104 may have a reduced manufacturing cycle type and a reduced cost as compared to the conventional capacitor.

FIGS. 3A-3F illustrate examples of stages of a first fabrication process that may be used to fabricate a device. The stages of the first fabrication process are shown as cross-sectional views of formation of the device. The device may include the device 100 of FIG. 1 or the device 200 of FIG. 2. The device may include a passive device, such as a capacitor or an inductor. The capacitor and the inductor may include the capacitor 104 or the inductor 106 of FIG. 1, respectively.

Figure 3A:
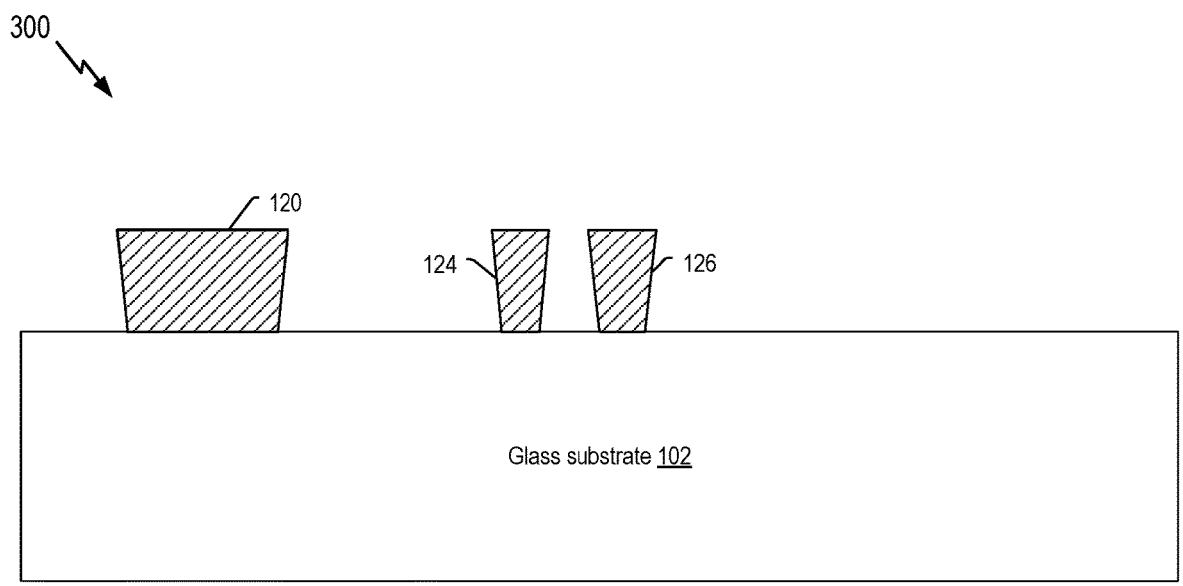
FIGS. 3A-3F are diagrams of an illustrative example of a process flow of fabricating the electronic device of FIG. 1.

Referring to FIG. 3A, a first stage of the first fabrication process is depicted and generally designated 300. FIG. 3A shows the glass substrate 102 and the first metal structures 120, 124, 126. The first metal structures 120, 124, 126 may be formed using a first mask. For example, the first metal structures 120, 124, 126 may be formed by depositing a seed layer (e.g., a titanium (Ti) layer, a copper (Cu) layer, or a layer that includes a combination of titanium (Ti) and copper (Cu)) on the glass substrate 102, spin-coating a photoresist (e.g., a negative photoresist) on the seed layer, and creating cavities in the photoresist using a first mask to expose portions of the seed layer. The seed layer may be deposited by atomic layer deposition (ALD), chemical vapor deposition (CVD), physical vapor deposition (PVD), sputtering, evaporation, or a combination thereof. The seed layer may be configured to enable and/or enhance a plating process, such as electroplating process. Metal, such as copper (Cu), may be deposited in the cavities. For example, an electroplating process may be used to deposit a particular thickness of the metal. After the metal is deposited, the photoresist may be removed and a selective etch may be performed to remove one or more portions of the seed layer. Removing the photoresist and the one or more portions of the seed layer may form the first metal structures 120, 124, 126 and may expose a surface of the glass substrate 102. The first metal structures 120, 124, 126 may include the metal and the seed layer.

Figure 3B:
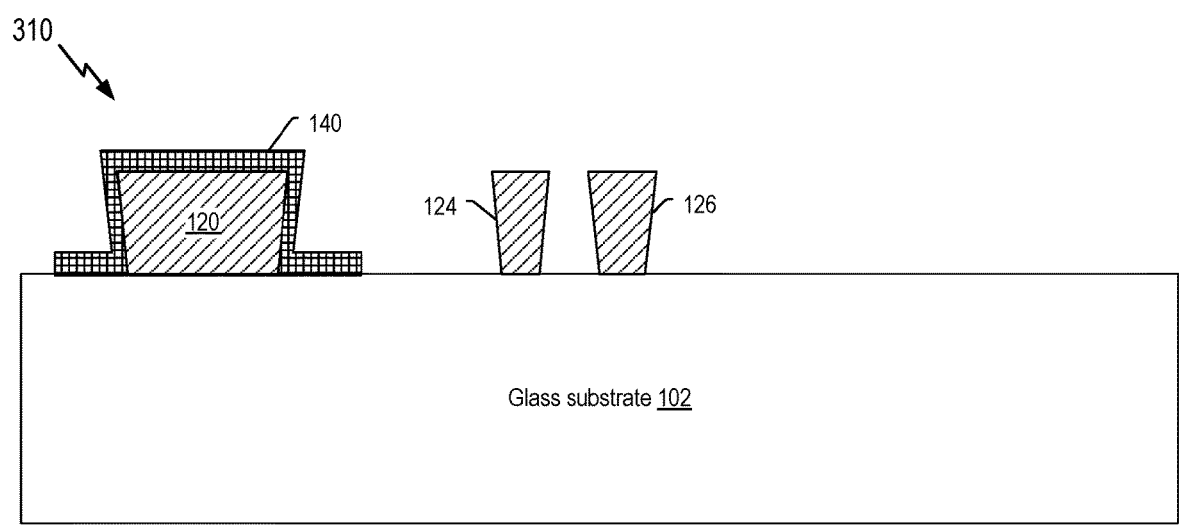

Referring to FIG. 3B, a second stage of the first fabrication process is depicted and generally designated 310. In FIG. 3B, the dielectric structure 140 has been formed on the first metal structure 120. The dielectric structure 140 may include a dielectric material, such as tantalum pentoxide ($Ta_2O_5$), silicon nitride ($SiN_x$), silicon dioxide ($SiO_2$), silicon oxynitride ($Si_xON_y$), and/or aluminum oxide (e.g., $AlO_{x\ and/or}\ Al_2O_3$), as illustrative, non-limiting examples. For example, the dielectric material may be deposited using chemical vapor deposition (CVD). In some implementations, the CVD may include a plasma enhanced CVD (PECVD). As another example, anodization may be used to grow the dielectric material, such as when the dielectric material includes tantalum pentoxide ($Ta_2O_5$). A second photoresist may be applied and patterned (using a second mask) to enable the dielectric material to be etched to form the dielectric structure 140. Although the dielectric structure 140 is illustrated as being a single layer of dielectric material, in other implementations, the dielectric structure 140 may include multiple layers of one or more dielectric materials.

Figure 3C:
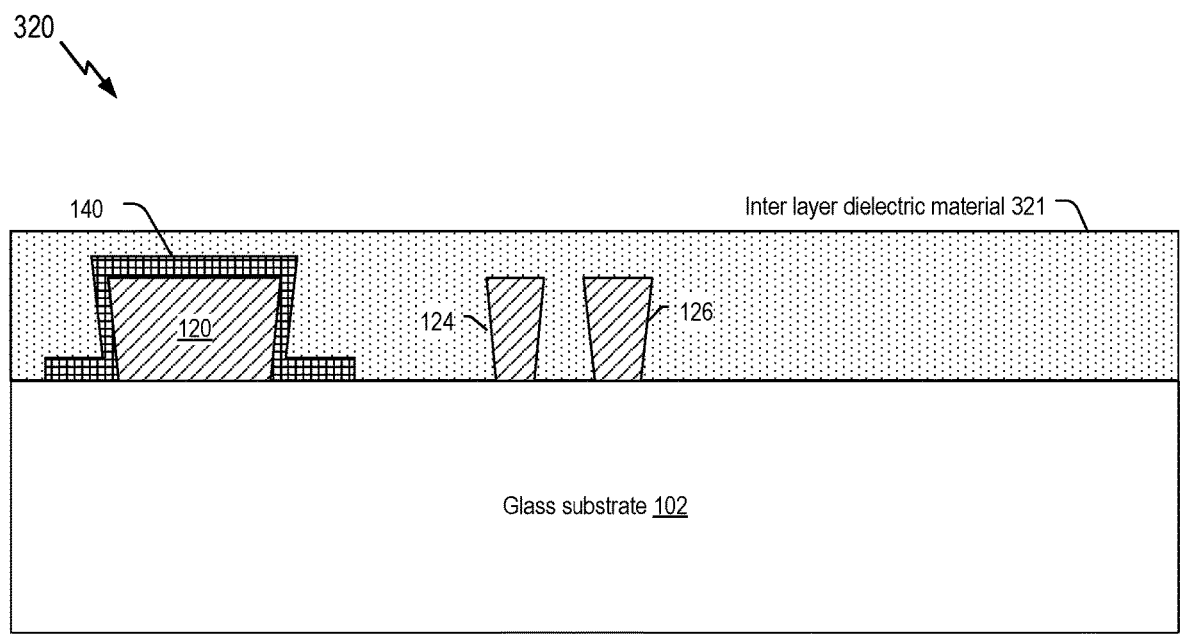

Referring to FIG. 3C, a third stage of the first fabrication process is depicted and generally designated 320. In FIG. 3C, a dielectric material 321 (e.g., a first inter layer dielectric material) has been deposited on the glass substrate, the first metal structures 120, 124, 126, and the dielectric structure 140. The dielectric material 321 may include polyimide (PI), benzocyclobuten (BCB), polybenzoxazole (PBO), an acrylic, and/or other materials, as illustrative, non-limiting examples. In some implementations, the dielectric material 321 may be deposited and planarized, such as planarized using a chemical mechanical planarization (CMP) process. In other implementations, the dielectric material 321 may be deposited using spin-coating and a surface of the dielectric material 321 may be planar and/or substantially planar. The dielectric material 321 may be associated with (e.g., patterned to form) the first dielectric layer 110, as described with reference to FIG. 3C.

Figure 3D:
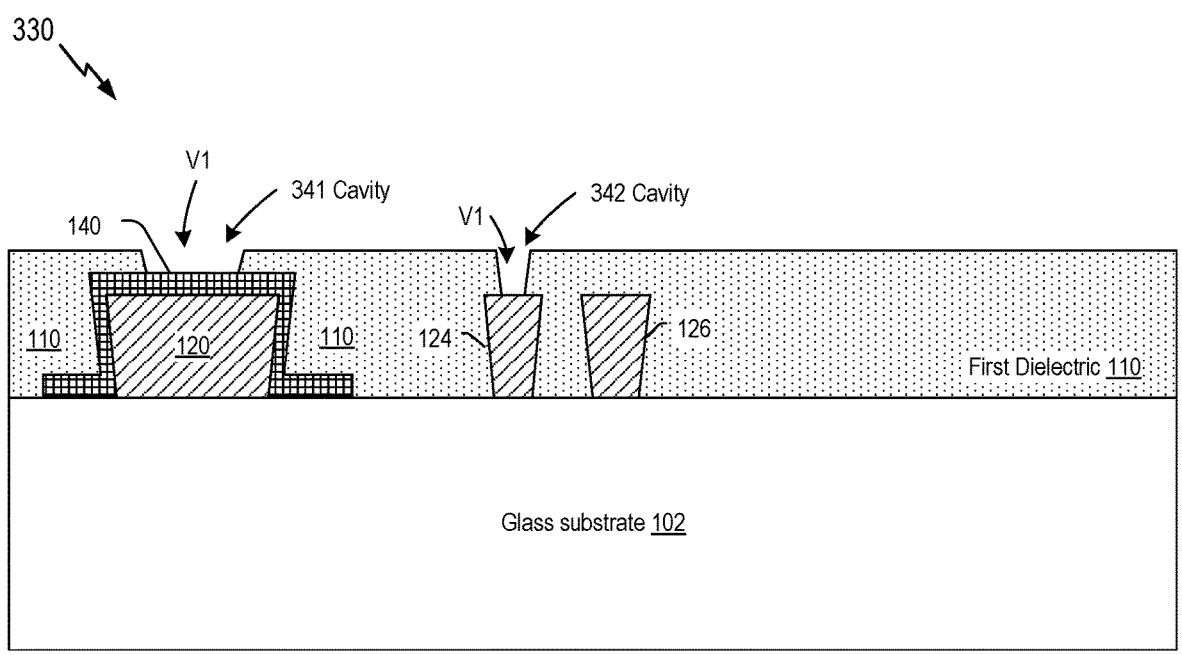

Referring to FIG. 3D, a fourth stage of the first fabrication process is depicted and generally designated 330. FIG. 3D shows the device after formation of one or more cavities (V1) in the dielectric material 321. For example, a third photoresist may be applied and patterned (using a third mask) to be used to etch the dielectric material 321 and used to form the one or more cavities (V1). Formation of the one or more cavities (V1) may form the first dielectric layer 110. The one or more cavities (V1) may include a first cavity 341 and a second cavity 342. Formation of the first cavity 341 may expose a portion of a surface of the dielectric structure 140, and formation of the second cavity 342 may expose a portion of a surface of the first metal structure 124. The first cavity 341 may be associated with (e.g., define) a surface area of an electrode, such as a top electrode, of the passive device (e.g., the capacitor). For example, a surface area of the dielectric structure 140 exposed by the first cavity 341 may correspond to a surface area (e.g., a capacitive area) of the electrode that is formed on the dielectric structure 140 as described further herein.

Figure 3E:
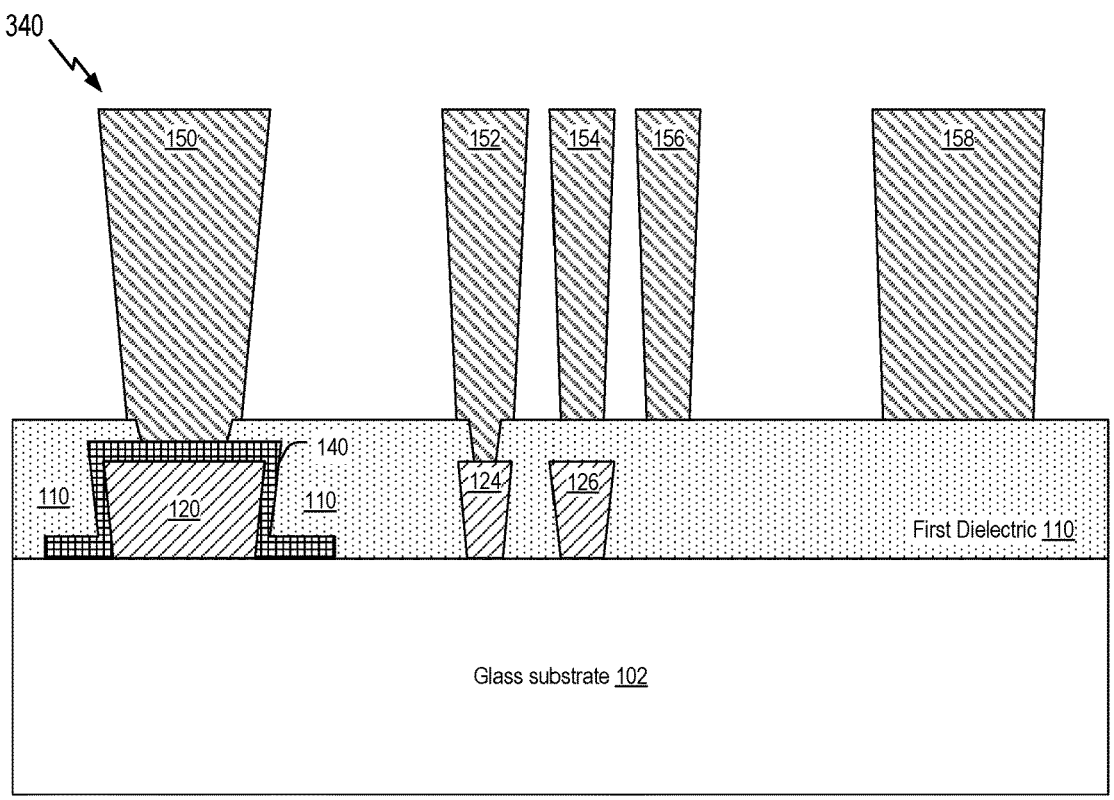

Referring to FIG. 3E, a fifth stage of the first fabrication process is depicted and generally designated 340. FIG. 3E shows the device after formation of the second metal structure 150-158. For example, the second metal structure 150-158 may have been formed using a fourth photoresist. Prior to forming the second metal structure 150-158, the fourth photoresist may be deposited on the first dielectric layer 110 and patterned (using a fourth mask) to form one or more cavities in the fourth photoresist. An electroplating process may be performed to form the second metal structure 150-158 in the one or more cavities. After forming the second metal structure 150-158, the photoresist may be removed to leave the second metal structure 150-158 as illustrated in FIG. 3E.

Figure 3F:
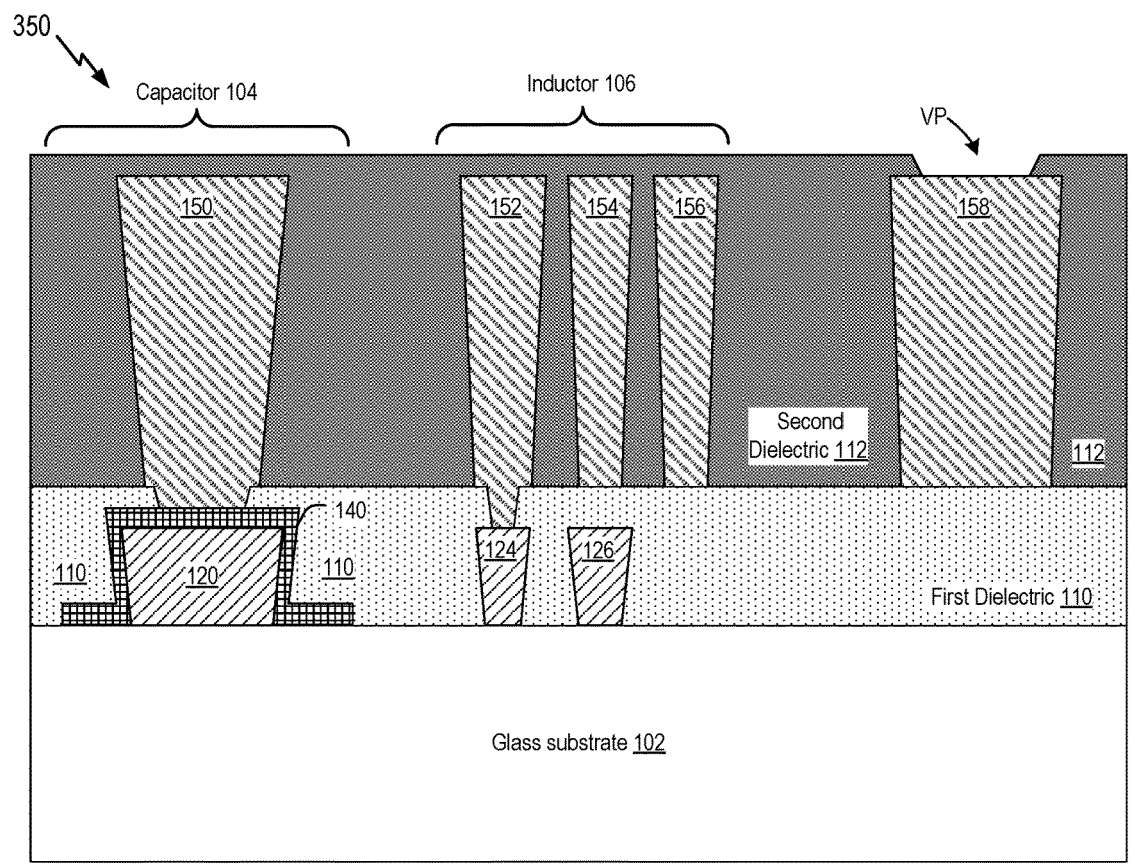

Referring to FIG. 3F, a sixth stage of the first fabrication process is depicted and generally designated 350. In FIG. 3F, the second dielectric layer 112 has been formed and a cavity (VP) has been created which exposes a portion of the second metal structure 158. For example, a fifth photoresist may be applied to a material of the second dielectric layer 112. The fifth photoresist may be patterned (using a fifth mask) to enable an etch to be performed to form the cavity (VP). Referring to FIG. 1, the ball 108 may be formed in the cavity (VP). The device of FIG. 3F includes the capacitor 104 and the inductor 106.

FIGS. 4A-4E illustrate examples of stages of a second fabrication process that may be used to fabricate a device. The stages of the second fabrication process are shown as cross-sectional views of formation of the device. The device may include the device 100 of FIG. 1 or the device 200 of FIG. 2. The device may include a passive device, such as a capacitor or an inductor. The capacitor and the inductor may include the capacitor 104 or the inductor 106 of FIG. 1, respectively.

Figure 4A:
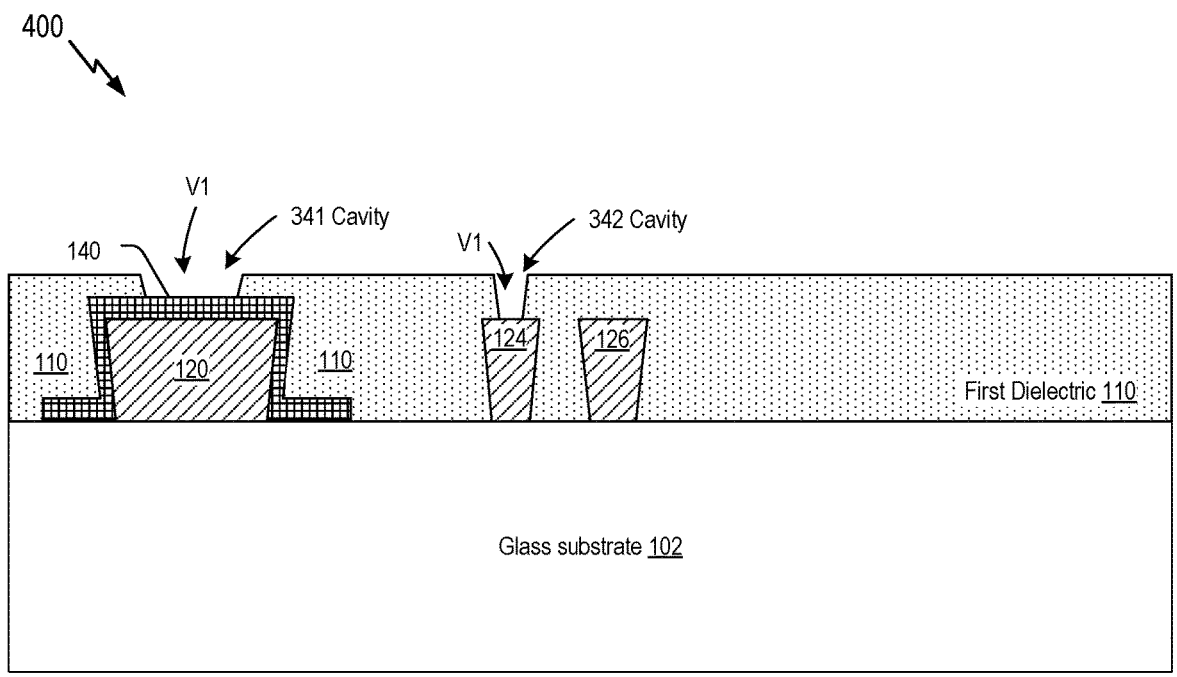
FIGS. 4A-4E are diagrams of an illustrative example of a process flow of fabricating the electronic device of FIG. 1.

Referring to FIG. 4A, a first stage of the second fabrication process is depicted and generally designated 400. FIG. 4A shows the device after formation of one or more cavities (V1) to form the first dielectric layer 110. The one or more cavities (V1) may include the first cavity 341 and the second cavity 342. Formation of the first cavity 341 may expose a portion of a surface of the dielectric structure 140 and formation of the second cavity 342 may expose a portion of a surface of the first metal structure 124. The first stage 400 may be the same as the fourth stage 330 of FIG. 3D.

Figure 4B:
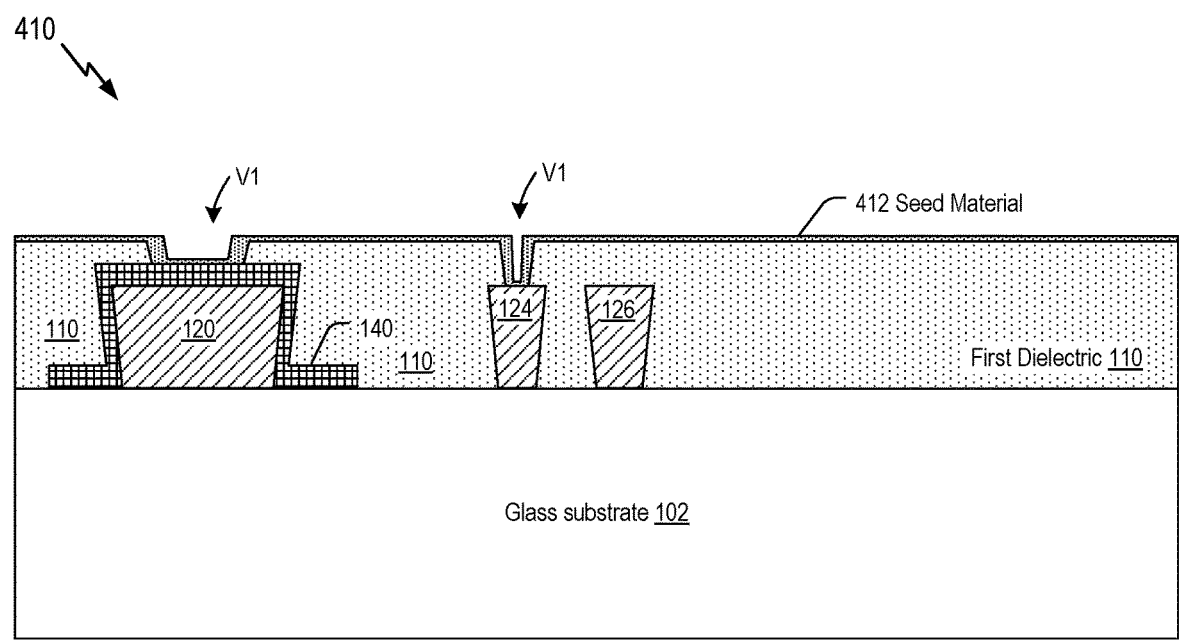

Referring to FIG. 4B, a second stage of the second fabrication process is depicted and generally designated 410. In FIG. 4B, a seed material 412 has been formed on first dielectric layer 110, the dielectric structure 140, and the first metal structure 124. The seed material 412 may include copper (Cu), titanium (Ti), tungsten (W), or a combination thereof, as illustrative, non-limiting examples. The seed material 412 may be deposited as a single layer, such as a layer of titanium (Ti). Alternatively, the seed material 412 may be deposited as multiple layers, such as a layer of titanium (Ti) and a layer of copper (Cu).

Figure 4C:
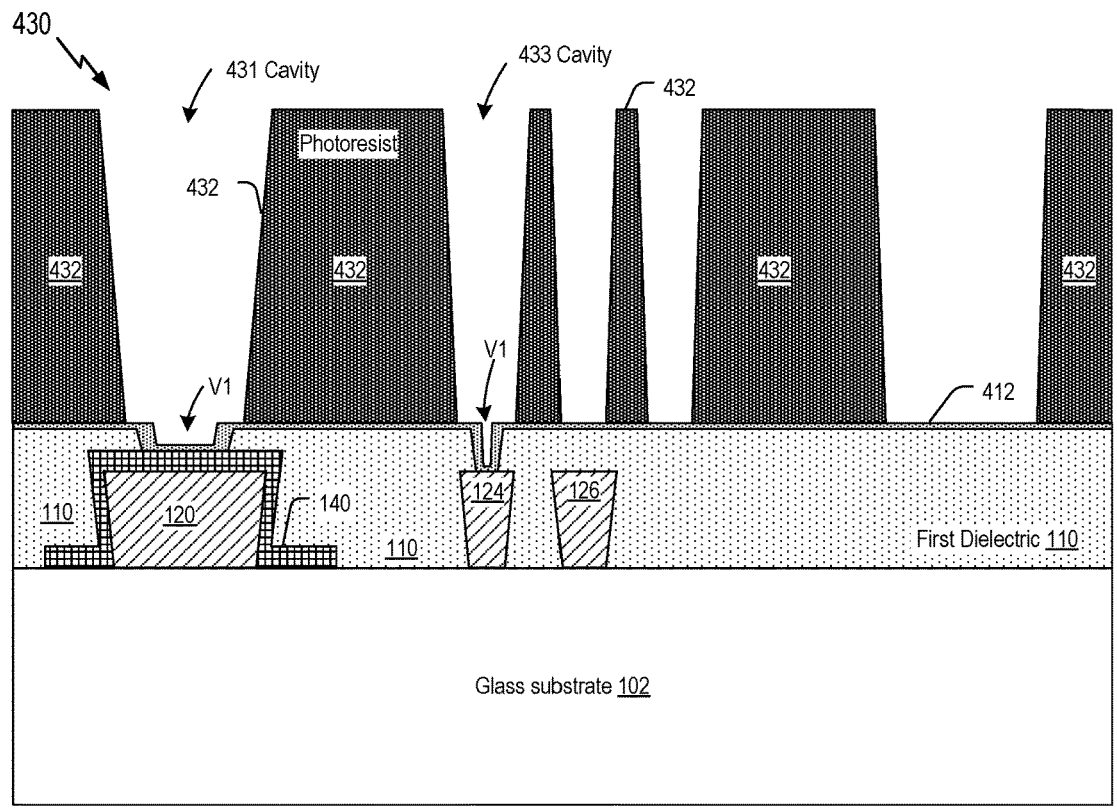

Referring to FIG. 4C, a third stage of the second fabrication process is depicted and generally designated 430. In FIG. 4C, a photoresist 432 has been deposited on the first dielectric layer 110 and one or more second cavities have been created in and/or through the photoresist 432. For example, a photoresist material may have been deposited and selectively exposed (using a mask) to form a pattern of the one or more second cavities. The one or more second cavities may include a third cavity 431 and a fourth cavity 433. Formation of the third cavity 431 may expose a portion of the seed material 412 on the dielectric structure 140 and a portion of the first cavity 341 (V1). Formation of the fourth cavity 433 may expose another portion of the seed material 412 on the first metal structure 124 and a portion of the second cavity 342 (V1).

Figure 4D:
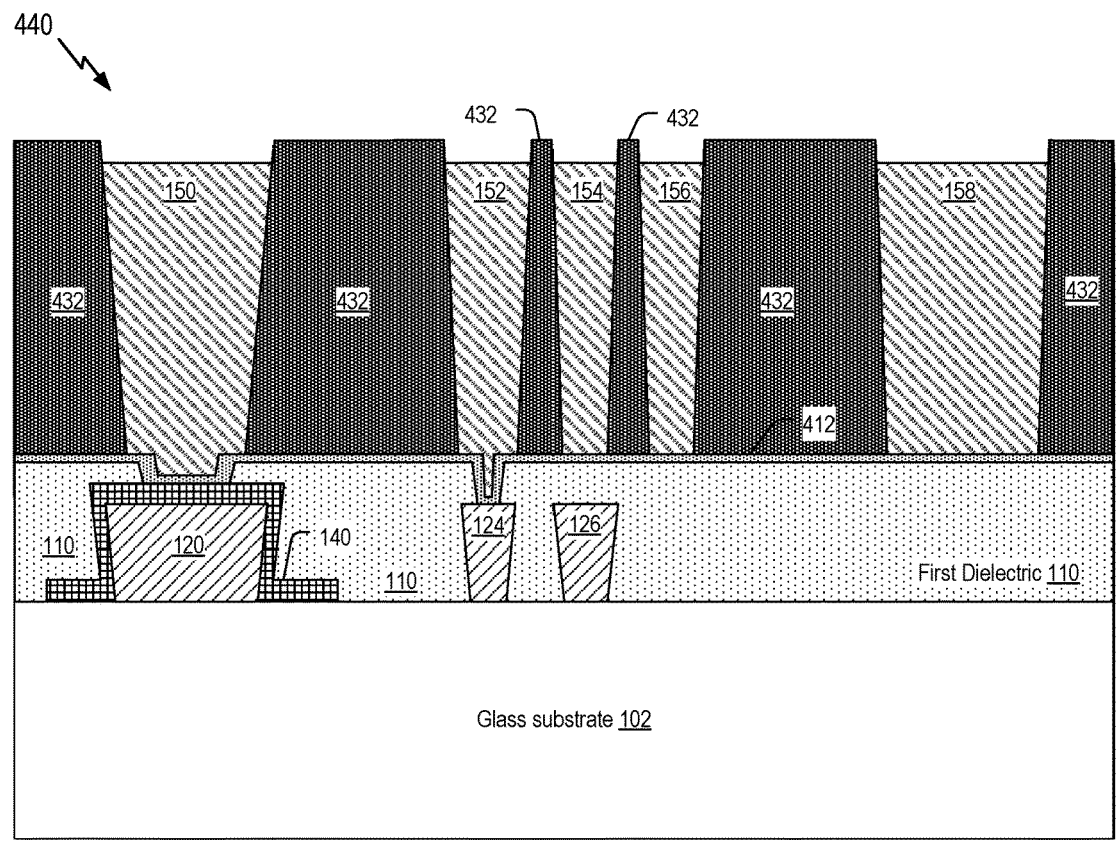

Referring to FIG. 4D, a fourth stage of the second fabrication process is depicted and generally designated 440. In FIG. 4D, the second metal structure 150-158 have been formed in the one or more second cavities of the photoresist 432. The second metal structures 150-158 may include a metal, such as copper (Cu). To form the second metal structures 150-158, an electroplating process may be used to deposit a particular thickness of the metal. The second metal structures 150-158 have been formed on the seed material 412.

Figure 4E:
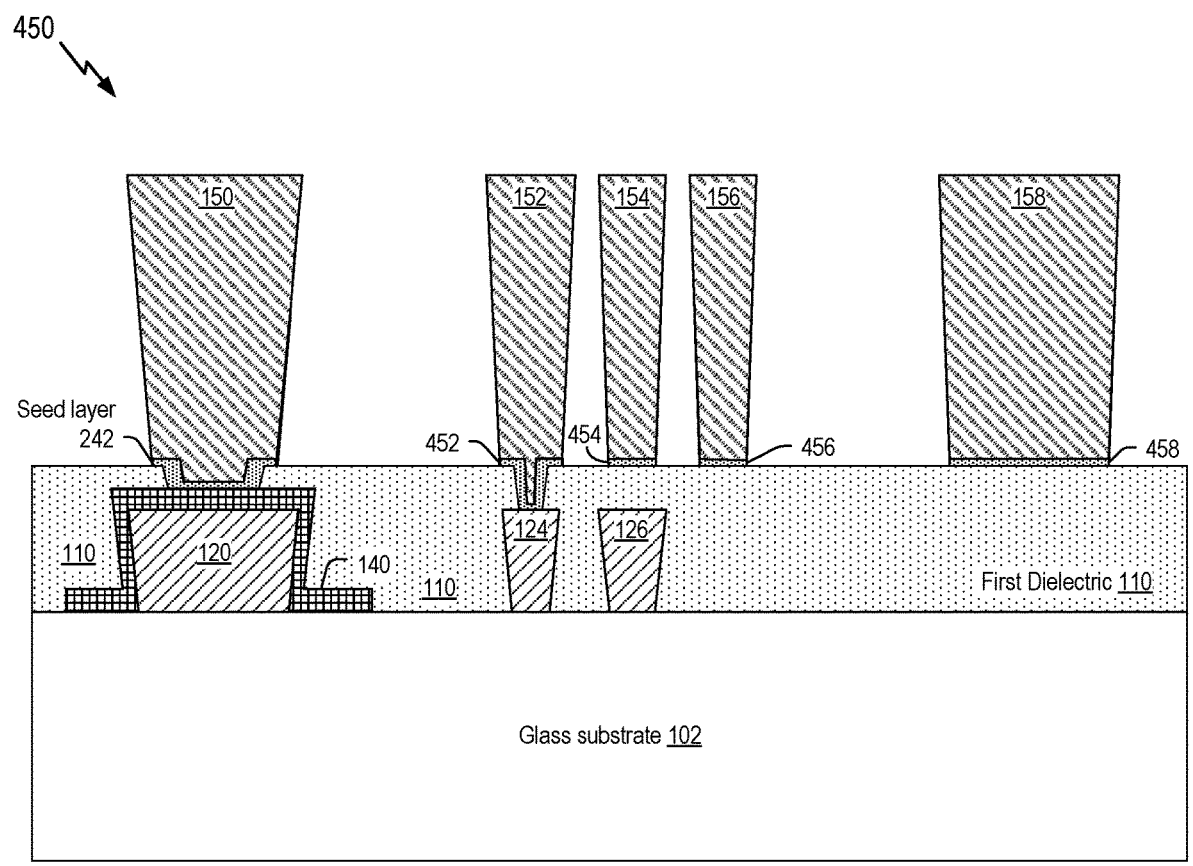

Referring to FIG. 4E, a fifth stage of the second fabrication process is depicted and generally designated 450. In FIG. 4E, the photoresist 432 has been removed and a selective etch has been performed to remove one or more portions of the seed material 412. Removal of the one or more portions of the seed material 412 may form seed layers 242, 452, 454, 456, 458. Removal of the one or more portions of the seed material 412 may also expose a portion of the surface of the first dielectric layer 110. After removal of the photoresist 432 and the one or more portions of the seed material 412, a second dielectric material corresponding to the second dielectric layer 112 of FIG. 1 may be deposited.

Figure 5:
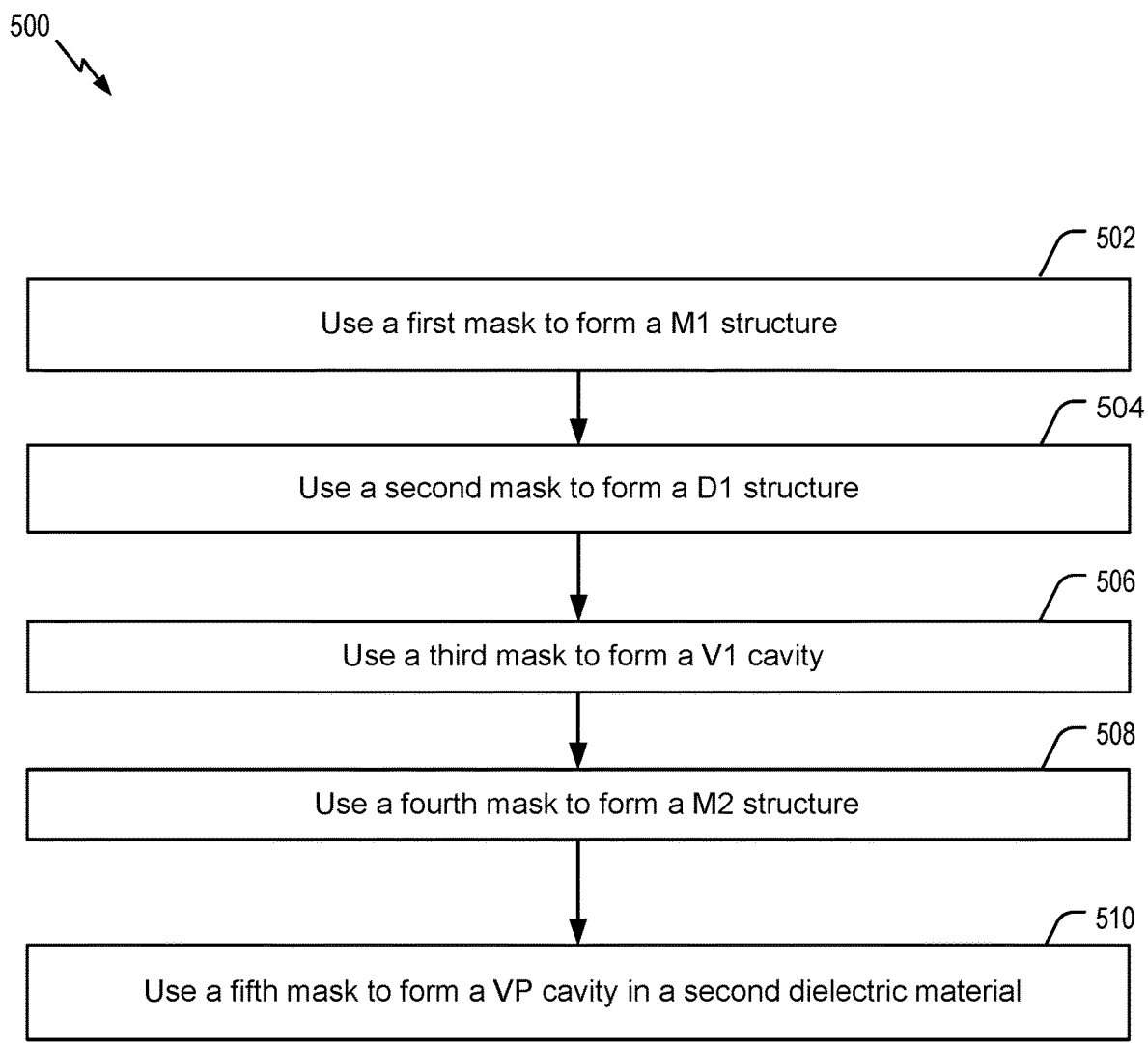
FIG. 5 is a flow chart of a particular illustrative aspect of a method of forming the electronic device of FIG. 1.

Referring to FIG. 5, a process flow diagram of an illustrative aspect of a method of forming a device is depicted and generally designated 500. The device may include the device 100 of FIG. 1, the device 200 of FIG. 2, a device formed according to the process shown in FIGS. 3A-3F, or a device formed according to the process show in FIGS. 4A-4E. The device may include a passive device, such as a capacitor (e.g., the capacitor 104 of FIG. 1) and/or an inductor (e.g., the inductor 106 of FIG. 1).

The method 500 may include using a first mask to form a M1 structure, at 502. For example, a first patterned photoresist may be formed using the first mask to enable forming the first metal structures 120, 124, 126 of FIG. 3A. For example, the first mask may be applied to a first photoresist to enable selective exposure of the first photoresist to form a pattern of cavities in the photoresist. Metal may be deposited (e.g., electroplated) into the cavities and the first patterned phot resist may be removed to leave the first metal structures 120, 124, 126.

The method 500 may further include using a second mask to form a dielectric structure (D1), at 504. The dielectric structure (D1) may include or correspond to the dielectric structure 140 of FIG. 1. For example, a second patterned photoresist may be formed using the second mask and may enable etching a dielectric material associated with the dielectric structure 140. For example, the dielectric material may include tantalum pentoxide ($Ta_2O_5$), silicon nitride ($SiN_x$), silicon dioxide ($SiO_2$), silicon oxynitride ($Si_xON_y$), and/or aluminum oxide (e.g., $AlO_{x\ and/or}\ Al_2O_3$), as illustrative, non-limiting examples.

The method 500 may include using a third mask to form a V1 cavity, at 506. For example, a third photoresist may be deposited on the dielectric material 321 of FIG. 3C. The third photoresist may be patterned (using the third mask) to form a third patterned photoresist. An etch process may be performed after formation of the third patterned photoresist. The third patterned photoresist may enable the etch process to form the one or more cavities (V1), such as the first cavity 341 and/or the second cavity 342 of FIGS. 3D and 4A.

The method 500 may include using a fourth mask to form a M2 structure, at 508. Referring to FIG. 4C, a fourth photoresist may be deposited on the first dielectric layer 110 after the one or more cavities (V1) are formed. For example, the fourth photoresist may be deposited on the seed material 412 of FIGS. 4B-4D. The fourth photoresist may be patterned (using the fourth mask) to form a fourth patterned photoresist associated with one or more cavities in and/or through the photoresist 432. The one or more cavities may expose portions of the seed material 412 at least on the first metal structures 120, 124. The M2 structure may be formed in a particular cavity of the one or more cavities. The M2 structure may include one of the second metal structures 150-158 of FIGS. 3E, 3F, 4D, 4E.

The method 500 may include using a fifth mask to form a VP cavity in a second dielectric material, at 510. The VP cavity may expose a portion of a metal structure, such as the M2 structure. Alternatively, the VP cavity may expose a portion of another structure corresponding to an M2 layer. Referring to FIG. 3F, a fifth photoresist may be formed on a dielectric material associated with the second dielectric layer 112. The fifth photoresist may be patterned using the fifth mask and an etch process may be performed using the fifth patterned photoresist. The VP cavity may include the passivation layer cavity (VP) through the second dielectric layer 112 to expose a portion of one of the second metal structures 150-158.

The method 600 may be used to form a passive device that includes an improved RF performance (e.g., a capacitor Q-factor of a capacitor) as compared to a conventional passive device. Additionally, the method 500 may have a reduced mask count as compared to a conventional method of forming a passive device, which may reduce a cost of manufacturing and may reduce a manufacturing cycle time. For example, the conventional method may use additional masks to form additional metal structures of the passive device. To illustrate, the conventional method may use six or more masks while the method 500 uses five masks.

Figure 6:
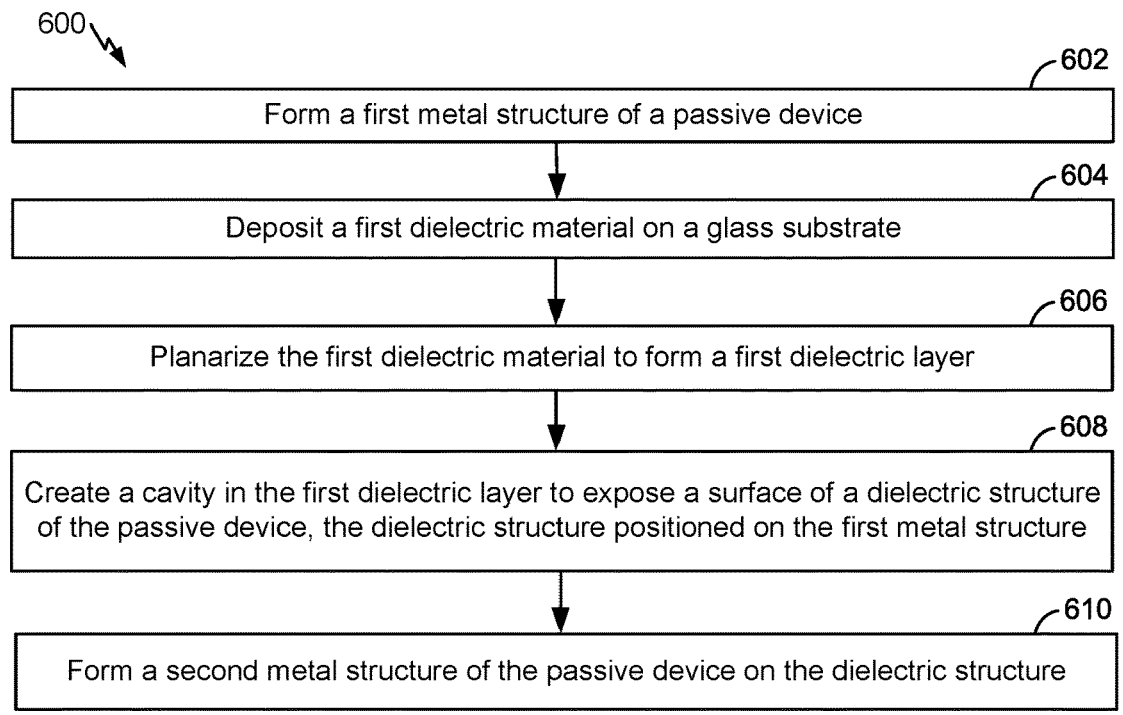
FIG. 6 is a flow chart of a particular illustrative aspect of another method of forming the electronic device of FIG. 1.

Referring to FIG. 6, a process flow diagram of an illustrative aspect of a method of forming a device is depicted and generally designated 600. The device, such as a passive-on-glass (POG) device, may include the device 100 of FIG. 1, the device 200 of FIG. 2, the device formed according to the process shown in FIGS. 3A-3F, or the device formed according to the process shown in FIGS. 4A-4E.

The method 600 may include using forming a first metal structure of a passive device, at 602. For example, the first metal structure may include or correspond to the first metal structure 120 of FIG. 1. The first metal structure is formed on a surface of the glass substrate, such as the glass substrate 102 of FIG. 1. The passive device may include a capacitor (e.g., the capacitor 104 of FIG. 1), such as a metal-insulator-metal (MIM) capacitor.

The method 600 may further include depositing a first dielectric material on a glass substrate, at 604. The first dielectric material may include or correspond to the dielectric material 321 of FIG. 3C. The first dielectric material may be associated with the first dielectric layer 110 of FIG. 1.

The method 600 may include planarizing the first dielectric material to form a first dielectric layer, at 606. The first dielectric layer may include or correspond to the first dielectric layer 110 of FIG. 1. Referring to FIG. 3C, the dielectric material 321 may be deposited and planarized. Planarizing the first dielectric material to form the first dielectric layer may be performed prior to forming a metal structure on the first dielectric material.

The method 600 may include creating a cavity in the first dielectric layer to expose a surface of a dielectric structure of the passive device, the dielectric structure positioned on the first metal structure, at 608. The cavity may include or correspond to the one or more cavities (V1) of FIG. 3D, such as the first cavity 341. The dielectric structure may include or correspond to the dielectric structure 140 of FIG. 1.

The method 600 may include forming a second metal structure of the passive device on the dielectric structure, at 610. For example, the second metal structure may include or correspond to the second metal structure 150 of FIG. 1. A top surface (e.g., the top surface 290) of the second metal structure may be above a planarized surface (e.g., the surface 292) of the first dielectric layer. In some implementation, the method 600 may include, prior to depositing the first dielectric material, forming the dielectric structure on a first metal structure.

After creating the cavity, the method 600 may include depositing a seed material on the dielectric structure. For example, the seed material may be deposited at least in part on the dielectric structure. Additionally or alternatively, the seed material may be deposited on the first dielectric layer. The seed material may include or correspond to the seed material 412 of FIG. 4B. A photoresist material, such as a material of the photoresist 432 of FIG. 4C, may be deposited on the seed material and a second cavity may be created in the photoresist material to expose a surface of the seed material. The second cavity may include or correspond to the third cavity 431 of FIG. 4C. The second metal structure may be formed in the second cavity. For example, the second metal structure may be formed on the seed material.

After forming the second metal structure, the method 600 may include etching a seed material to form a seed layer between the second metal structure and the dielectric structure. The seed layer may include or correspond to the seed layer 242 of FIG. 2 or 4E. In some implementations, the passive device (e.g., the capacitor) may include a single seed layer positioned between the second metal structure and the dielectric structure.

In some implementations, a portion (e.g., the first portion 132) of the second metal structure may be formed in the cavity. The first metal structure may correspond to a first plate of a capacitor, and the portion may correspond to a second plate of the capacitor. Additionally or alternatively, the first metal structure may correspond to a M1 layer of a device that includes the passive device. The portion of the second metal structure may correspond to a V1 layer of the device, and a second portion (e.g., the second portion 288) of the second metal structure may correspond to a M2 layer of the device.

The method 600 may be used to form a passive device that includes an improved RF performance (e.g., a capacitor Q-factor of a capacitor) as compared to a conventional passive device. Additionally, the method 600 may have a reduced mask count as compared to a conventional method of forming a passive device, which may reduce a cost of manufacturing and may reduce a manufacturing cycle time. For example, the conventional method may use additional masks to form additional metal structures of the passive device. To illustrate, the conventional method may use more than six masks while the method 600 uses less than six masks.

Figure 7:
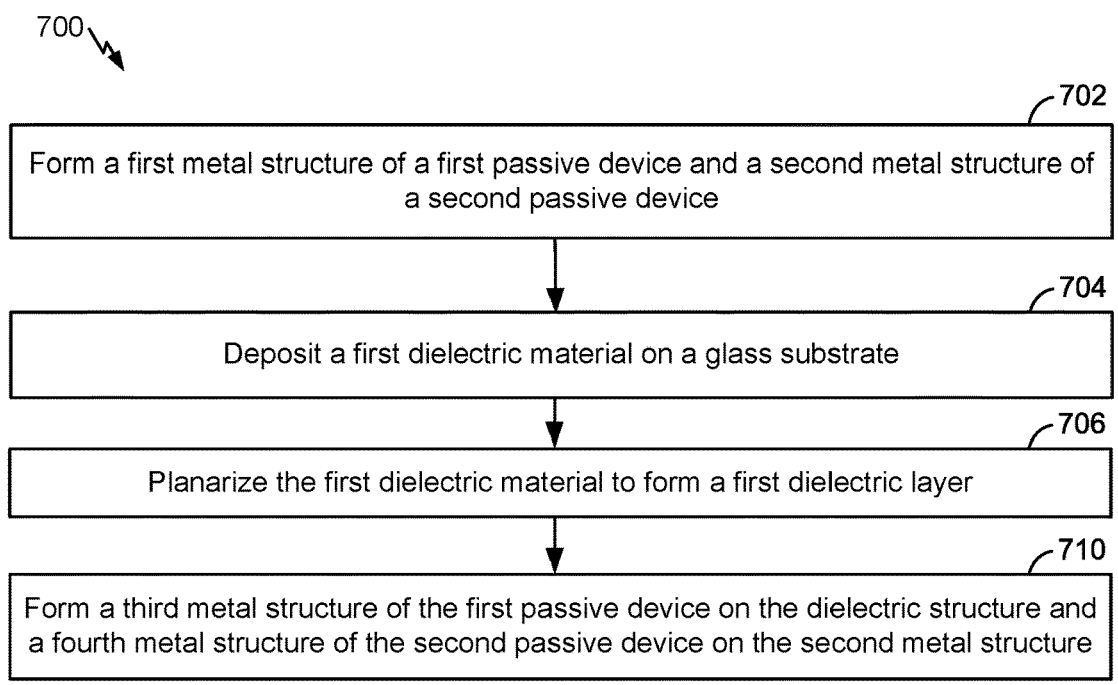
FIG. 7 is a flow chart of a particular illustrative aspect of another method of forming the electronic device of FIG. 1.

Referring to FIG. 7, a flow diagram of an illustrative aspect of a method 700 of forming a device is depicted. The device may include the device 100 of FIG. 1, the device 200 of FIG. 2, the device formed according to the process shown in FIGS. 3A-3F, or the device formed according to the process shown in FIGS. 4A-4E.

The method 700 may include forming a first metal structure of a first passive device and a second metal structure of a second passive device, at 702. The first passive device and the second passive device may include or correspond to the capacitor 104 and the inductor 106, respectively, of FIG. 1. For example, the first metal structure may include or correspond to the first metal structure 120 of FIG. 1, and the second metal structure may include or correspond to the first metal structure 124, 126 of FIG. 1. In some implementations, the capacitor may be a metal-insulator-metal (MIM) capacitor.

The method 700 may further include depositing a first dielectric material on a glass substrate, at 704. The first dielectric material may include or correspond to the dielectric material 321 of FIG. 3C. The first dielectric material may be associated with the first dielectric layer 110 of FIG. 1. The glass substrate may include or correspond to the glass substrate 102 of FIG. 1.

The method 700 may further include planarizing the first dielectric material to form a first dielectric layer, at 706. The first dielectric layer may include or correspond to the first dielectric layer 110 of FIG. 1. Referring to FIG. 3C, the dielectric material 321 may be deposited and planarized. Planarizing the first dielectric material to form the first dielectric layer may be performed prior to forming one or more metal structures on the first dielectric material and/or on the second metal structure.

The method 700 may further include creating a first cavity in the first dielectric layer to expose a first surface of a dielectric structure of the first passive device and a second cavity to expose a second surface of the second metal structure, the dielectric structure positioned one the first metal structure, at 708. The first cavity and the second cavity may include or correspond to the first cavity 341 and the second cavity 342, respectively, of FIG. 3D. The dielectric structure may include or correspond to the dielectric structure 140 of FIG. 1.

The method 700 may include forming a third metal structure of the first passive device on the dielectric structure and a fourth metal structure of the second passive device on the second metal structure. The dielectric structure may be positioned between the first metal structure and the third metal structure, and the fourth metal structure may be coupled to the second metal structure. For example, the third metal structure may include or correspond to the second metal structure 150, and the fourth metal structure may include or correspond to the second metal structure 152 of FIG. 1. In some implementations, a first portion (e.g., the first portion 132) of the third metal structure is formed in the first cavity and a second portion (e.g., the portion 134) of the fourth metal structure is formed in the second cavity.

In some implementations, after creating the first cavity and the second cavity, the method 700 may include depositing a photoresist material on the first dielectric layer. The photoresist material may include or correspond to the photoresist 432 of FIG. 4C. In some implementations, prior to depositing the photoresist material, a seed material (e.g., the seed material 412 of FIG. 4B) may be deposited on the dielectric structure and on the second metal structure. A third cavity and a fourth cavity may be created in the photoresist material. The third cavity and the fourth cavity may include or correspond to the third cavity 431 and the fourth cavity 433, respectively, of FIG. 4C. Creating the third cavity may expose a first portion of the seed material on the dielectric structure and creating the fourth cavity may expose a second portion of the seed material on the second metal structure. The third metal structure (of the first passive device) may be formed in the third cavity, and a fourth metal structure (of the second passive device) may be formed in the fourth cavity.

In some implementations, the first metal structure and the second metal structure may correspond to a M1 layer of a device that includes the first passive device and the second passive device. The third metal structure and the fourth metal structure may correspond to a M2 layer of the device.

In a particular implementation, the second passive device (e.g., the inductor) includes a second metal structure. The second metal structure may include or correspond to an underpass of the inductor. The inductor may further include a fourth metal structure. In some implementations, the fourth metal structure may include a via structure (e.g., the portion 134) and a metal structure portion. The via structure (e.g., the portion 134) may be coupled to the second metal structure, and the metal structure portion may include or correspond to at least a portion of a winding of the inductor. The via structure (e.g., the portion 134) may be positioned between the second metal structure and the metal structure portion. In some implementations, the second metal structure may correspond to a M1 layer of the device, the via structure (e.g., the portion 134) may correspond to a V1 layer of the device, and the metal structure portion may correspond to a M2 layer of the device.

In some implementations, the method 700 may also include, prior to forming the second cavity, forming a second dielectric structure on the second metal structure. The first passive device may include a first metal-insulator-metal (MIM) capacitor and the second passive device may include a second MIM capacitor.

The method 700 may be used to form a passive device that includes an improved RF performance (e.g., a capacitor Q-factor of a capacitor) as compared to a conventional passive device. Additionally, the method 700 may form the passive device using a reduced mask count as compared to a conventional method of forming a passive device, which may reduce a cost of manufacturing and may reduce a manufacturing cycle time.

The process shown in FIGS. 3A-3F, the process shown in FIGS. 4A-4E, the method 500 of FIG. 5, the method 600 of FIG. 6, and/or the method 700 of FIG. 7 may be controlled by a processing unit such as a central processing unit (CPU), a controller, a field-programmable gate array (FPGA) device, an application-specific integrated circuit (ASIC), another hardware device, firmware device, or any combination thereof. As an example, the process shown in FIGS. 3A-3F, the process shown in FIGS. 4A-4E, the method 500 of FIG. 5, the method 600 of FIG. 6, and/or the method 700 of FIG. 7 can be performed by one or more processors that execute instructions to control fabrication equipment. To illustrate, a portion of one of the process shown in FIGS. 3A-3F, the process shown in FIGS. 4A-4E, the methods of FIGS. 5-7 may be combined with a second portion of one of one of the process shown in FIGS. 3A-3F, the process shown in FIGS. 4A-4E, the methods of FIGS. 5-7. Additionally, one or more steps described with reference to one of the process shown in FIGS. 3A-3F, the process shown in FIGS. 4A-4E, the methods of FIGS. 5-7, may be optional, may be performed at least partially concurrently, and/or may be performed in a different order than shown or described.

Figure 8:
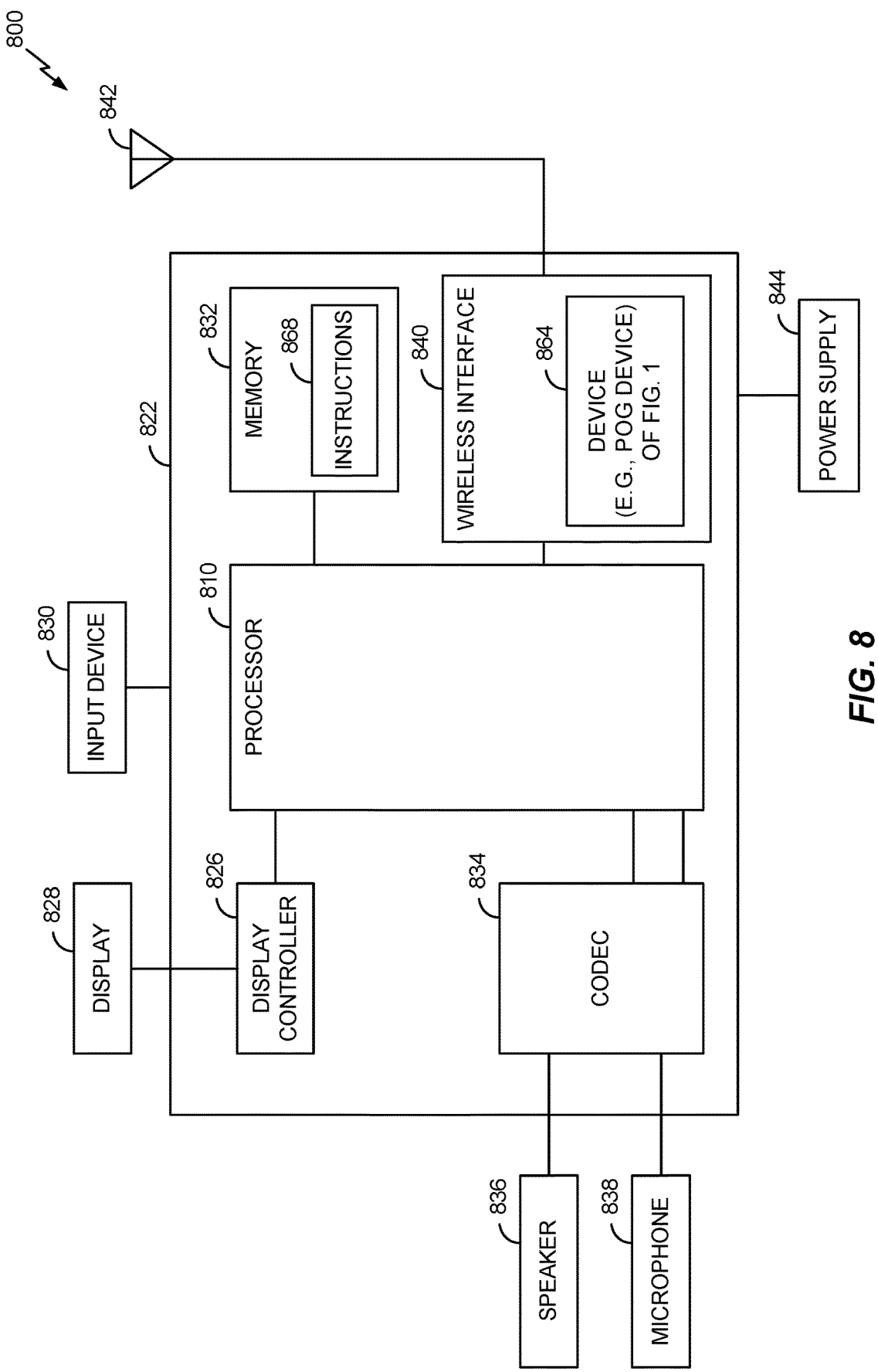
FIG. 8 is a block diagram of an electronic device including the electronic device of FIG. 1.

Referring to FIG. 8, a block diagram of a particular illustrative aspect of an electronic device 800, such as a wireless communication device, is depicted. The device 800 includes a processor 810, such as a digital signal processor (DSP), coupled to a memory 832. The memory 832 includes instructions 868 (e.g., executable instructions), such as computer-readable instructions or processor-readable instructions. The instructions 868 may include one or more instructions that are executable by a computer, such as the processor 810.

FIG. 8 also shows a display controller 826 that is coupled to the processor 810 and to a display 828. A coder/decoder (CODEC) 834 can also be coupled to the processor 810. A speaker 836 and a microphone 838 can be coupled to the CODEC 834.

FIG. 8 also indicates that a wireless interface 840 can be coupled to the processor 810 and to an antenna 842. The wireless interface 840, or components thereof, may include the device 100 of FIG. 1. To illustrate, the wireless interface 840 may be constructed in such a way that components of the wireless interface 840 may be electrically connected to one or more structures, such as the capacitor 104 of FIG. 1, that are included in the device 100.

In some implementations, a device 864, the processor 810, the display controller 826, the memory 832, the CODEC 834, and the wireless interface 840 are included in a system-in-package or system-on-chip device 822. In some implementations, an input device 830 and a power supply 844 are coupled to the system-on-chip device 822. Moreover, in a particular aspect, as illustrated in FIG. 8, the display 828, the input device 830, the speaker 836, the microphone 838, the antenna 842, and the power supply 844 are external to the system-on-chip device 822. However, each of the display 828, the input device 830, the speaker 836, the microphone 838, the antenna 842, and the power supply 844 can be coupled to a component of the system-on-chip device 822, such as an interface or a controller.

Although the device 864 is depicted as being included in the wireless interface 840 (e.g., wireless controller), in other implementations, the device 864 may be included in another component of the device 800 or a component coupled to the device 800. For example, the device 864 may be included in the processor 810, the memory 832, the power supply 844, the input device 830, the display 828, the display controller 826, the CODEC 834, the speaker 836, or the microphone 838.

In conjunction with one or more of the described embodiments of FIGS. 1-8, an apparatus is disclosed that may include means for providing support for circuitry. The means for providing may include or correspond to the glass substrate 102 of FIG. 1, one or more other structures configured to provide support, or any combination thereof.

The apparatus may also include first means for storing a first charge. The first means for storing the first charge may be associated with a metal 1 layer of the device. The first means for storing may include or correspond to the first metal structure 120 of FIG. 1, one or more other structures configured to store a first charge, or any combination thereof.

The apparatus may also include second means for storing a second charge. The first means for storing the second charge may be associated with a via 1 layer of the device. The second means for storing may include or correspond to the second metal structure 150, the first portion 132, of FIG. 1, the seed layer 242 of FIG. 2, one or more other structures configured to store a second charge, or any combination thereof.

The apparatus may also include means for electrically isolating the first means for storing and the second means for storing. The means for electrically isolating may include or correspond to the dielectric structure 140 of FIG. 1, one or more other structures configured to electrically isolate the first means for storing and the second means for storing, or any combination thereof.

One or more of the disclosed aspects may be implemented in a system or an apparatus, such as the electronic device 800, that may include a communications device, a fixed location data unit, a mobile location data unit, a mobile phone, a cellular phone, a satellite phone, a computer, a tablet, a portable computer, a display device, a media player, or a desktop computer. Alternatively or additionally, the electronic device 800 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, a satellite, a vehicle, any other device that includes a processor or that stores or retrieves data or computer instructions, or a combination thereof. As another illustrative, non-limiting example, the system or the apparatus may include remote units, such as hand-held personal communication systems (PCS) units, portable data units such as global positioning system (GPS) enabled devices, meter reading equipment, or any other device that includes a processor or that stores or retrieves data or computer instructions, or any combination thereof.

Figure 9:
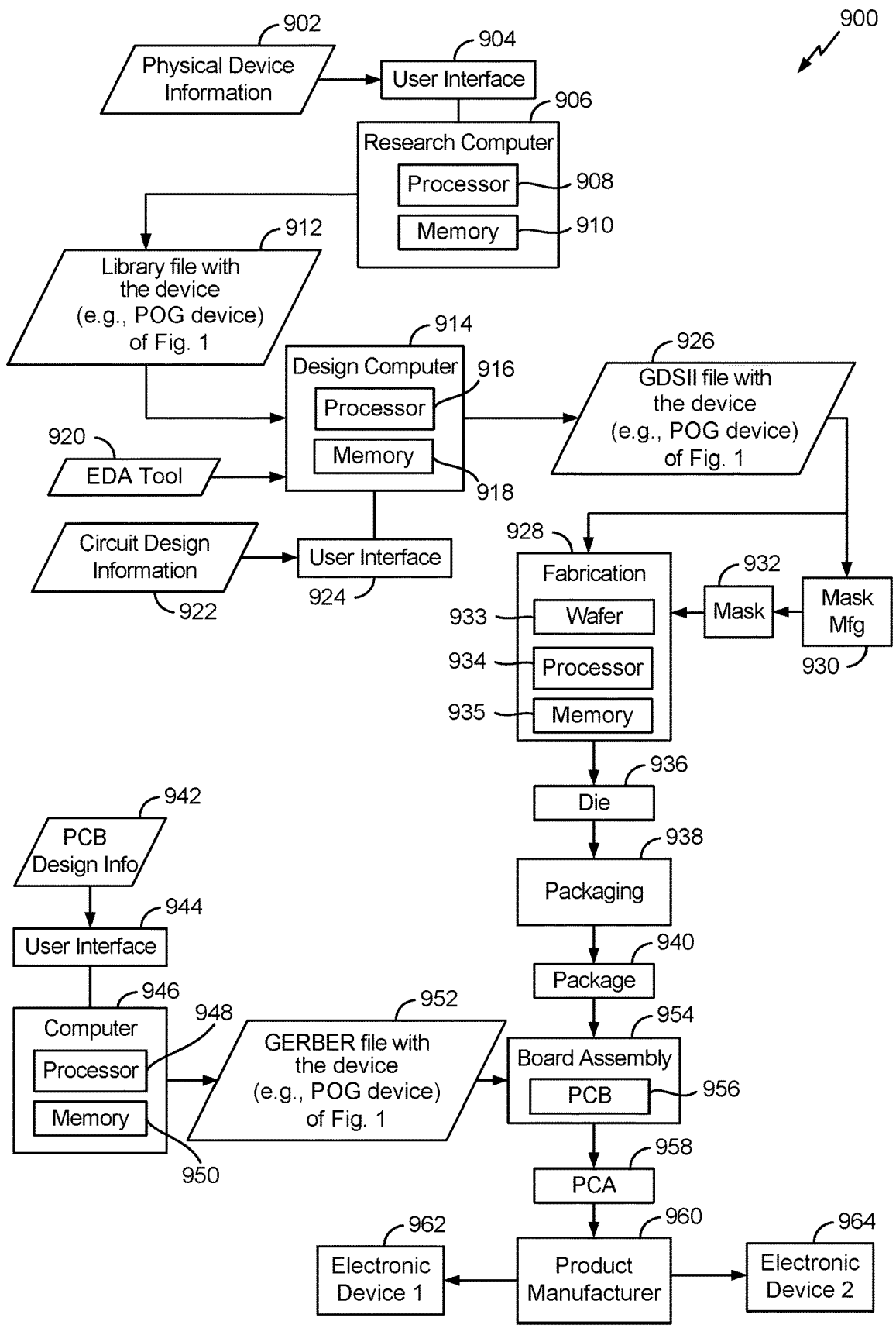
FIG. 9 is a data flow diagram of a particular illustrative aspect of a manufacturing process to manufacture electronic devices that include the electronic device of FIG. 1.

The foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include wafers that are then cut into dies and packaged into a chip. The chips are then employed in devices described above. FIG. 9 depicts a particular illustrative aspect of an electronic device manufacturing process 900.

Physical device information 902 is received at the manufacturing process 900, such as at a research computer 906. The physical device information 902 may include design information representing at least one physical property of the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof. For example, the physical device information 902 may include physical parameters, material characteristics, and structure information that is entered via a user interface 904 coupled to the research computer 906. The research computer 906 includes a processor 908, such as one or more processing cores, coupled to a computer-readable medium (e.g., a non-transitory computer-readable medium), such as a memory 910. The memory 910 may store computer-readable instructions that are executable to cause the processor 908 to transform the physical device information 902 to comply with a file format and to generate a library file 912.

In some implementations, the library file 912 includes at least one data file including the transformed design information. For example, the library file 912 may include a library of devices including a device that includes the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof, that is provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit including the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof. For example, a user of the design computer 914 may enter circuit design information 922 via a user interface 924 coupled to the design computer 914.

The circuit design information 922 may include design information representing at least one physical property of a component of the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof. To illustrate, the circuit design property may include identification of particular circuits and relationships to other elements in a circuit design, positioning information, feature size information, interconnection information, or other information representing a physical property of components of the device 100 of FIG. 1, the device 200 of FIG. 2, a device formed according to the process shown in FIGS. 3A-3F, a device formed according to the process shown in FIGS.

4A-4E, a device formed according to the method 500 of FIG. 5, the method 600 of FIG. 6, and/or the method 700 of FIG. 7, or a combination thereof.

The design computer 914 may be configured to transform the design information, including the circuit design information 922, to comply with a file format. To illustrate, the file format may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof, in addition to other circuits or information. To illustrate, the data file may include information corresponding to a system-on-chip (SOC) that includes the device 100 of FIG. 1, the device 200 of FIG. 2, device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof, and that also includes additional electronic circuits and components within the SOC.

The GDSII file 926 may be received at a fabrication process 928 to manufacture the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof, according to transformed information in the GDSII file 926. For example, a device manufacture process may include providing the GDSII file 926 to a mask manufacturer 930 to create one or more masks, such as masks to be used with photolithography processing, illustrated as a representative mask 932. The mask 932 may be used during the fabrication process to generate one or more wafers 933, which may be tested and separated into dies, such as a representative die 936. The die 936 includes a circuit including a device that includes the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof.

For example, the fabrication process 928 may include a processor 934 and a memory 935 to initiate and/or control the fabrication process 928. The memory 935 may include executable instructions such as computer-readable instructions or processor-readable instructions. The executable instructions may include one or more instructions that are executable by a computer such as the processor 934.

The fabrication process 928 may be implemented by a fabrication system that is fully automated or partially automated. For example, the fabrication process 928 may be automated according to a schedule. The fabrication system may include fabrication equipment (e.g., processing tools) to perform one or more operations to form a device, such as the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof. For example, the fabrication equipment may be configured to deposit one or more materials, etch one or more materials, etch one or more dielectric materials, perform a chemical mechanical planarization process, perform a thermal anneal, deposit a conductive material, perform a chemical vapor deposition (CVD) process, etc., or a combination thereof, as illustrative, non-limiting examples.

The fabrication system (e.g., an automated system that performs the fabrication process 928) may have a distributed architecture (e.g., a hierarchy). For example, the fabrication system may include one or more processors, such as the processor 934, one or more memories, such as the memory 935, and/or controllers that are distributed according to the distributed architecture. The distributed architecture may include a high-level processor that controls or initiates operations of one or more low-level systems. For example, a high-level portion of the fabrication process 928 may include one or more processors, such as the processor 934, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In some implementations, the fabrication system may include multiple processors that are distributed in the fabrication system. For example, a controller of a low-level system component may include a processor, such as the processor 934.

Alternatively, the processor 934 may be a part of a high-level system, subsystem, or component of the fabrication system. In another implementation, the processor 934 includes distributed processing at various levels and components of a fabrication system.

Thus, the processor 934 may include processor-executable instructions that, when executed by the processor 934, cause the processor 934 to initiate or control formation of the device 100 of FIG. 1. For example, the executable instructions included in the memory 935 may enable the processor 934 to initiate formation of the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof. In some implementations, the memory 935 is a non-transient computer-readable medium storing computer-executable instructions that are executable by the processor 934 to cause the processor 934 to initiate formation of a device in accordance with at least a portion of the process shown in FIGS. 3A-3F, a device in accordance with at least a portion of the process shown in FIGS. 4A-4E, a device formed according to at least a portion of the method 500 of FIG. 5, the method 600 of FIG. 6, and/or the method 700 of FIG. 7, or any combination thereof. For example, the computer executable instructions may be executable to cause the processor 934 to initiate or control formation of the device 100 of FIG. 1.

As an illustrative example, the processor 934 may initiate or control forming a first metal structure of a passive device.

The processor 934 may further initiate or control depositing a first dielectric material on a glass substrate. The processor 934 may further initiate or control planarizing the first dielectric material to expose a portion of the first metal structure. The processor 934 may also initiate or control creating a cavity in the first dielectric layer to expose a surface of a dielectric structure of the passive device. The dielectric structure may be positioned on the first metal structure.

The die 936 may be provided to a packaging process 938 where the die 936 is incorporated into a representative package 940. For example, the package 940 may include the single die 936 or multiple dies, such as a system-in-package (SiP) arrangement. For example, the package 940 may include or correspond to the system in package or system-on-chip device 822 of FIG. 8. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged device on a circuit board, the packaged device including the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof.

The computer 946 may be configured to transform the PCB design information 942 to generate a data file, such as a GERBER file 952 with data that includes physical positioning information of a packaged device on a circuit board, as well as layout of electrical connections such as traces (e.g., metal lines) and vias (e.g., via structures), where the packaged device corresponds to the package 940 including the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof. In other implementations, the data file generated by the transformed PCB design information may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines to perform various steps of a PCB production process. The PCB 956 may be populated with electronic components including the package 940 to form a representative printed circuit assembly (PCA) 958.

The PCA 958 may be received at a product manufacture process 960 and integrated into one or more electronic devices, such as a first representative electronic device 962 and a second representative electronic device 964. For example, the first representative electronic device 962, the second representative electronic device 964, or both, may include or correspond to the device 800 of FIG. 8. As an illustrative, non-limiting example, the first representative electronic device 962, the second representative electronic device 964, or both, may include a communications device, a fixed location data unit, a mobile location data unit, a mobile phone, a cellular phone, a satellite phone, a computer, a tablet, a portable computer, or a desktop computer, into which the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof, is integrated.

Alternatively or additionally, the first representative electronic device 962, the second representative electronic device 964, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that includes a processor or that stores or retrieves data or computer instructions, or a combination thereof, into which the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof, is integrated. As another illustrative, non-limiting example, one or more of the electronic devices 962 and 964 may include remote units, such as mobile phones, hand-held personal communication systems (PCS) units, portable data units such as personal data assistants, global positioning system (GPS) enabled devices, navigation devices, fixed location data units such as meter reading equipment, any other device that includes a processor or that stores or retrieves data or computer instructions, or any combination thereof. Although FIG. 9 illustrates remote units according to teachings of the disclosure, the disclosure is not limited to these illustrated units. Aspects of the disclosure may be suitably employed in any device which includes active integrated circuitry including memory and on-chip circuitry.

A device that includes the device 100 of FIG. 1, the device 200 of FIG. 2, a device formed according to the process shown in FIGS. 3A-3F, a device formed according to the process shown in FIGS. 4A-4E, a device formed according to the method 500 of FIG. 5, the method 600 of FIG. 6, and/or the method 700 of FIG. 7, or a combination thereof, may be fabricated, processed, and incorporated into an electronic device, as described in the illustrative process 900. One or more aspects disclosed with respect to FIGS. 1-9 may be included at various processing stages, such as within the library file 912, the GDSII file 926 (e.g., a file having a GDSII format), and the GERBER file 952 (e.g., a file having a GERBER format), as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical aspects such as the mask 932, the die 936, the package 940, the PCA 958, other products such as prototype circuits or devices (not shown), or any combination thereof. Although various representative stages of production from a physical device design to a final product are depicted, in other implementations fewer stages may be used or additional stages may be included. Similarly, the process 900 may be performed by a single entity or by one or more entities performing various stages of the process 900.

Although one or more of FIGS. 1-9 may illustrate systems, apparatuses, and/or methods according to the teachings of the disclosure, the disclosure is not limited to these illustrated systems, apparatuses, and/or methods. One or more functions or components of any of FIGS. 1-9 as illustrated or described herein may be combined with one or more other portions of another of FIGS. 1-9. Accordingly, no single aspect or single example described herein should be construed as limiting and aspects and/or examples of the disclosure may be suitably combined without departing from the teachings of the disclosure.

Those of skill would further appreciate that the various illustrative logical blocks, configurations, modules, circuits, and algorithm steps described in connection with the aspects disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. For example, a storage medium may be coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A method of passive device forming, the method comprising:
   forming a dielectric structure to cover an entire first surface of a first metal structure of a passive device on a glass substrate;
   creating a cavity in a dielectric layer of the passive device to expose a portion of a surface of the dielectric structure; and
   forming seed material and a second metal structure of the passive device on the dielectric structure, the seed material and the second metal structure comprising a via, the via separated and electrically isolated from the first metal structure by the dielectric structure, the dielectric layer of the passive device including an upper surface and a first side surface defining the cavity, the upper surface physically contacting a first surface of the second metal structure, the first side surface physically contacting the seed material and the second metal structure, and the seed material in physical contact with the portion of the surface.

2. The method of claim 1, wherein the dielectric structure and the first metal structure each contact the glass substrate, wherein the passive device comprises a passive-on-glass (POG) device, and wherein the first metal structure corresponds to a first plate of a capacitor.

3. The method of claim 1, wherein:
   the passive device comprises a metal 1 (M1) layer,
   the via corresponds to a via 1 (V1) layer, and
   a distance from the glass substrate to the metal 1 (M1) layer is less than a distance from the glass substrate to the via 1 (V1) layer.

4. The method of claim 3, wherein:
   the via is physically coupled to a metal 2 (M2) layer,
   the distance from the glass substrate to the metal 1 (M1) layer is less than a distance from the glass substrate to the metal 2 (M2) layer, and
   the via 1 (V1) layer is located between the metal 1 (M1) layer and the metal 2 (M2) layer.

5. The method of claim 1, wherein the seed material is included in a seed layer positioned between and physically connected to the second metal structure and the dielectric structure.

6. The method of claim 1, wherein the seed material is included in a single seed layer positioned between and physically contacting the second metal structure and the dielectric structure.

7. The method of claim 1, further comprising:
   forming a third metal structure of a second passive device on the glass substrate;
   forming the dielectric layer to enclose the dielectric structure and the third metal structure;
   creating a second cavity in the dielectric layer to expose a surface of the third metal structure; and
   forming seed material and a fourth metal structure of the second passive device on the third metal structure.

8. The method of claim 7, wherein the second passive device comprises an inductor.

9. The method of claim 1, further comprising, after creating the cavity:
   depositing the seed material on the dielectric structure;
   depositing a photoresist material on the seed material; and
   creating a second cavity in the photoresist material to expose a surface of the seed material.

10. The method of claim 9, wherein the second metal structure is formed on the seed material in the second cavity.

11. An apparatus formed according to the method of claim 1.

12. A method of forming a passive device, the method comprising:
    forming a dielectric structure to cover an entire first surface of a first metal structure of a first passive device on a glass substrate, a first portion of the dielectric structure in physical contact with the glass substrate;

creating a first cavity in a dielectric layer to expose a surface of the dielectric structure, a first portion of the dielectric layer in physical contact with the glass substrate;

creating a second cavity in the dielectric layer to expose a second metal structure of a second passive device on the glass substrate, the second metal structure separated and electrically isolated from the first metal structure by the dielectric structure; and forming seed material and a third metal structure of the first passive device on the dielectric structure and a fourth metal structure of the second passive device on the second metal structure, the third metal structure comprising a via that is formed in the first cavity, the via on an upper surface of the dielectric structure and separated and electrically isolated from the first metal structure by the dielectric structure, the seed material including a first surface and a second surface physically contacting an upper surface and a side surface of the dielectric layer, respectively, and third and fourth surfaces physically contacting the third metal structure.

13. The method of claim 12, wherein the third surface of the seed material is opposite to the first surface of the seed material, wherein the fourth surface of the seed material is opposite to the second surface of the seed material, wherein the first passive device comprises a metal-insulator-metal (MIM) capacitor, and wherein the second passive device comprises an inductor.

14. The method of claim 12, wherein a portion of the third metal structure is formed on the seed material in the first cavity, and wherein a portion of the fourth metal structure is formed in the second cavity.

15. The method of claim 12, further comprising, after creating the first cavity and the second cavity:

depositing a photoresist material on the dielectric layer; and creating a third cavity and a fourth cavity in the photoresist material, the third metal structure formed in the third cavity, and the fourth metal structure formed in the fourth cavity.

16. The method of claim 15, further comprising, prior to depositing the photoresist material, depositing a seed layer on the dielectric structure and on a second metal structure, wherein creating the third cavity exposes a first portion of the seed layer on the dielectric structure, and wherein creating the fourth cavity exposes a second portion of the seed layer on the second metal structure.

17. The method of claim 16, wherein the dielectric structure is positioned between the first metal structure and the third metal structure, and wherein the fourth metal structure is coupled to the second metal structure.

18. The method of claim 16, wherein the first metal structure and the second metal structure correspond to a metal 1 (M1) layer of a device that includes the first passive device and a second passive device, and wherein the third metal structure and the fourth metal structure correspond to a metal (M2) layer of the device.

19. An apparatus formed according to the method of claim 12.

20. The method of claim 1, further comprising:

forming a third metal structure on the glass substrate; and forming a second dielectric structure to enclose the third metal structure, wherein the third metal structure and the second dielectric structure comprise a metal and an insulator of a metal-insulator-metal capacitor.

* * * * *